(12) United States Patent
Vaudo et al.

(10) Patent No.: US 6,958,093 B2
(45) Date of Patent: Oct. 25, 2005

(54) FREE-STANDING (AL, GA, IN)N AND PARTING METHOD FOR FORMING SAME

(75) Inventors: Robert P. Vaudo, New Milford, CT (US); George R. Brandes, Southbury, CT (US); Michael A. Tischler, Phoenix, AZ (US); Michael K. Kelly, Leonberg (DE)

(73) Assignee: Cree, Inc., Durham, NC (US)

( * ) Notice: Subject to any disclaimer, the term of this patent is extended or adjusted under 35 U.S.C. 154(b) by 185 days.

(21) Appl. No.: 09/947,253

(22) Filed: Sep. 5, 2001

(65) Prior Publication Data

US 2002/0068201 A1 Jun. 6, 2002

Related U.S. Application Data

(63) Continuation-in-part of application No. 09/929,789, filed on Aug. 14, 2001, which is a continuation of application No. 08/955,168, filed on Oct. 21, 1997, now abandoned, which is a continuation-in-part of application No. 08/188,469, filed on Jan. 27, 1994, now Pat. No. 5,679,152, application No. 09/947,253, which is a continuation-in-part of application No. 09/933,943, filed on Aug. 21, 2001, now Pat. No. 6,765,240, which is a continuation of application No. 08/955,168, which is a continuation-in-part of application No. 08/188,469.

(51) Int. Cl.$^7$ ............................................. C30B 25/04
(52) U.S. Cl. ............................ 117/90; 117/94; 117/95; 117/101; 117/913; 117/915; 117/952; 117/954
(58) Field of Search ............................... 117/90, 94, 95, 117/101, 913, 915, 952, 954

(56) References Cited

U.S. PATENT DOCUMENTS

| | | | |
|---|---|---|---|
| 3,326,820 A | 6/1967 | Cuomo et al. | 252/478 |
| 3,598,526 A | 8/1971 | Humi et al. | 23/192 |
| 3,634,149 A | 1/1972 | Knippenberg | 148/175 |
| 3,829,556 A | 8/1974 | Logan et al. | 423/409 |
| 3,922,703 A | 11/1975 | Pankove | 357/17 |
| 4,622,083 A | 11/1986 | Shih | |
| 4,727,047 A | 2/1988 | Bozler et al. | 437/89 |
| 4,931,132 A | 6/1990 | Aspnes et al. | |
| 4,985,742 A | 1/1991 | Pankove | 357/34 |
| 5,006,914 A | 4/1991 | Beetz, Jr. | 357/77 |
| 5,146,465 A | 9/1992 | Khan et al. | 372/45 |
| 5,239,188 A | 8/1993 | Takeuchi et al. | 257/76 |

(Continued)

FOREIGN PATENT DOCUMENTS

JP 56-59700 A 10/1979

OTHER PUBLICATIONS

Kelly, M.K., Ambacher, O., Dahlheimer, B., Groos, G., Dimitrov, R., Angerer, H., Stutzmann, M., *Appl. Phys. Lett.*, vol. 69, No. 12, 1749–1751, 1996.

(Continued)

*Primary Examiner*—Robert Kunemund
(74) *Attorney, Agent, or Firm*—Steven J. Hultquist; David C. Hall; Marianne Fuierer

(57) ABSTRACT

A method of forming a free-standing (Al, Ga, In)N article, by the steps including: providing an expitaxially compatible sacrificial template; depositing single crystal (Al, Ga, In)N material on the template to form a composite sacrificial template/(Al, Ga, In)N article including an interface between the sacrificial template and the (Al, Ga, In)N material; and interfacially modifying the composite sacrificial template/(Al, Ga, In)N article to part the sacrificial template from the (Al, Ga, In)N material and yield the free-standing (Al, Ga, In)N article. The free-standing (Al, Ga, In)N article produced by such method is of superior morphological character, and suitable for use as a substrate, e.g., for fabrication of microelectronic and/or optoelectronic devices and device precursor structures.

130 Claims, 4 Drawing Sheets

U.S. PATENT DOCUMENTS

| | | | |
|---|---|---|---|
| 5,334,277 A | | 8/1994 | Nakamura .................. 117/102 |
| 5,373,171 A | | 12/1994 | Imai et al. .................... 257/77 |
| 5,385,862 A | | 1/1995 | Moustakas .................. 437/107 |
| 5,433,169 A | | 7/1995 | Nakamura .................. 117/102 |
| 5,620,557 A | * | 4/1997 | Manabe et al. ............. 117/915 |
| 5,679,152 A | * | 10/1997 | Tischler et al. ............. 117/915 |
| 5,846,844 A | | 12/1998 | Akasaki et al. ............... 437/21 |
| 5,919,305 A | | 7/1999 | Solomon ...................... 117/90 |
| 5,954,874 A | | 9/1999 | Hunter ......................... 117/84 |
| 6,071,795 A | | 6/2000 | Cheung et al. |
| 6,146,457 A | * | 11/2000 | Solomon .................... 117/915 |
| 6,156,581 A | | 12/2000 | Vaudo et al. |
| 6,176,925 B1 | * | 1/2001 | Solomon et al. ............ 117/915 |
| 6,280,523 B1 | * | 8/2001 | Coman et al. .............. 117/915 |
| 6,331,208 B1 | * | 12/2001 | Nishida et al. ............. 117/915 |
| 6,420,242 B1 | | 7/2002 | Cheung et al. |
| 6,559,075 B1 | | 5/2003 | Kelly et al. |

OTHER PUBLICATIONS

Kelly, M.K., Ambacher, O., Dimitrov, R., Handschuh, R. Stutzmann, M., *physica status solidi*, vol. 159, R3, 1997.

Wong, W.S., Sands, T., Cheung, N.W., *Appl. Phys. Lett.*, vol. 72, No. 5, 599–601, 1998.

Tavernier, P.R., Verghese, P.M., Clarke, D.R., *Appl. Phys. Lett.*, vol. 74, No. 18, 2678–2680, 1999.

U.S. Appl. No. 08/955,168, filed Oct. 21, 1997, Tischler et al.

U.S. Appl. No. 09/179,049, filed Oct. 26, 1998, Vaudo et al.

U.S. Appl. No. 09/524,062, filed Mar. 13, 2000, Vaudo et al.

U.S. Appl. No. 09/605,195, filed Jun. 28, 2000, Flynn et al.

U.S. Appl. No. 09/929,789, filed Aug. 14, 2001, Tischler et al.

U.S. Appl. No. 09/933,943, filed Aug. 21, 2001, Tischler et al.

Hiroaki Misawa, et al. "Formation of Photonic crystals by femtosecond laser microfabrication", Proc. SPIE–Int. Soc. Opt. Eng. (2000), 4088 (Laser Precision Microfabrication), 29–32.

Stephen M. Kuebler, et al. "Three–dimensional micro–fabrication using two–photon–activated chemistry", Proc. SPIE–Int. Soc. Opt. Eng. (2000), 3937 (Micro– and Nano–photonic Materials and Devices), 97–105.

Chi–Kuang, Sun , et al. Large near resonance third order nonlinearity in GaN, Opt. Quantum Electron. (2000), 32 (4/5), 619–640.

Arup Neogi, et al. "Intersubband–transition–induced inter-band two–photon absorption by femtosecond optical excitation", Proc. SPIE–Int. Soc. Opt. Eng. (2000), 3940 (Ultrafast Phenomena in Semiconductors IV), 91–97.

Derwent Abstract of JP 56–59700A; Matsushita Elec. Ind. Co,; "Gallium Nitride Thin Single Crystal Film".

"Defect reduction in GaAs epitaxial layers using a GaAsP–InGaAs strained–layer superlattice," Tischler, et al., Appl. Phys. Lett. 46(3), PP. 294–296 (1985).

"GaN, AlN, and InN: A review," Strite, S., and Morkoc, J. Vac. Sci. Technol. B 10 (4), 1237–1266 (1992).

"Current Status of GaN and Related Compounds as Wide–Gap Semiconductors," Matsuoka, T., J. Crystal Growth 124, 433–438 (19920.

* cited by examiner

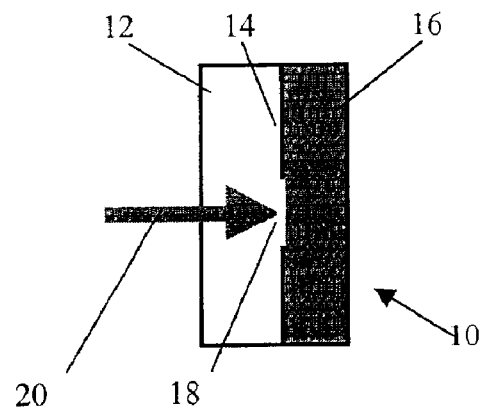
Figure 1
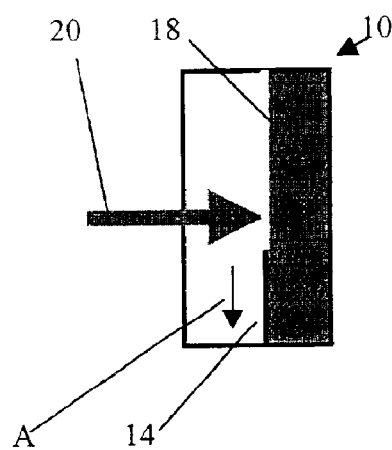 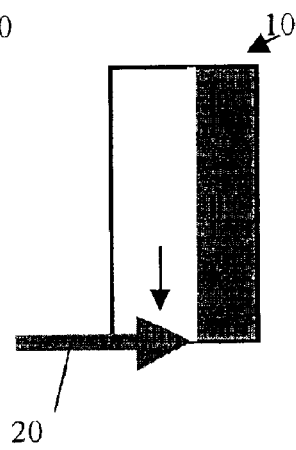 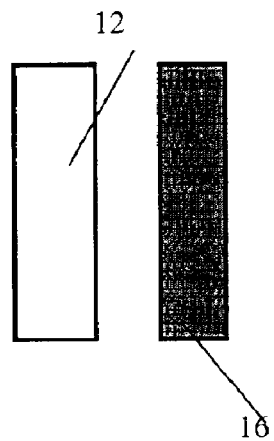
Figure 2  Figure 3  Figure 4

FREE-STANDING (AL, GA, IN)N AND PARTING METHOD FOR FORMING SAME

This application is a continuation-in-part of Ser. No. 09/929,789 filed Aug. 14, 2001, which is a continuation of Ser. No. 08/955,168 filed Oct. 21, 1997 abandoned, which is a continuation-in-part of Ser. No. 08/188,469 filed Jan. 27, 1994 now U.S. Pat No. 5,679,152. This application Ser. No. 09/947,253 is a continuation-in-part of Ser. No. 09/933,943 filed Aug. 21, 2001 now U.S. Pat No. 6,765,240 which is a continuation of Ser. No. 08/955,168 filed Oct. 21, 1997 abandoned, which is a continuation-in-part of Ser. No. 08/188,469 filed Jan. 27, 1994 U.S. now Pat No. 5,679,152.

GOVERNMENT RIGHTS IN INVENTION

Work related to the invention was done in the performance of Government Contract Nos. DAAL01-98-C-0071, N00014-00-3-0013, and DASG60-00-C-0036. The government has certain rights in the invention.

BACKGROUND OF THE INVENTION

1. Field of the Invention

The invention generally relates to methodology for forming a free-standing article, and to the free-standing article thereby formed. In particular, the invention relates to free-standing (Al, Ga, In)N articles, and to methods of forming same by interfacial separation of (Al, Ga, In)N from a base material or layer on which the (Al, Ga, In)N has been grown, to yield the separated (Al, Ga, In)N material as a free-standing body suitable for fabrication of microelectronic or optoelectronic devices.

2. Description of the Related Art

U.S. Pat. No. 5,679,152 describes the production of a free-standing (Al,Ga,In)N single crystal article on an epitaxially-compatible sacrificial template, in which a layer of single crystal (Al,Ga,In)N is deposited on the template, and sacrificial template is removed at or near the growth temperature to leave free-standing (Al,Ga,In)N.

This method produces a low defect density (e.g., $<10^7$ defects/cm$^2$) material as a result of the absence of thermal coefficient of expansion (TCE) differences associated with the substrate when a heteroepitaxial substrate material is used for the template, since the template is removed in situ. As a result, the internal stresses incident to the mismatch of TCE that normally accompany the cool-down of heteroepitaxial materials and that cause cracking and morphological defects, are avoided.

The present invention relates to free-standing (Al, Ga, In)N articles, and to formation of same by growth of (Al, Ga, In)N material on a sacrificial template, and interfacial separation of the (Al, Ga, In)N material from the template, to yield device-quality single crystal (Al, Ga, In)N free-standing articles.

SUMMARY OF THE INVENTION

The present invention relates in a broad aspect to a method of forming a free-standing article, including depositing on a substrate a material of construction for the free-standing article, to form a material/substrate composite article including an interface between the substrate and the material, and interfacially modifying the composite material/substrate article to part the substrate from the material and yield the free-standing article.

The modification of the interface is carried out in one preferred embodiment of the invention at elevated temperature, e.g., an elevated temperature within 500° C. of the temperature at which the material of construction for the free-standing article is formed on the substrate, and before the material/substrate composite article is cooled from elevated temperature to a lower temperature, e.g., ambient temperature. In such embodiment, the temperature at which the material of construction is formed on the substrate may for example be 600° C. or more.

The interface of the composite material/substrate article is the three-dimensional region between the substrate material and the material of construction for the free-standing article. The interface depth is a function of the interfacial modification process and the area of the interface is determined by the area of the composite material/substrate article. Typically the interface depth is $10^{-4}$ microns to $10^2$ microns deep.

The present invention relates in one aspect to a method of forming a free-standing (Al, Ga, In)N article, by the steps comprising:

providing an expitaxially compatible sacrificial template;

depositing single crystal (Al, Ga, In)N material on the template to form a composite sacrificial template/(Al, Ga, In)N article including an interface between the sacrificial template and the (Al, Ga, In)N material; and interfacially modifying the composite sacrificial template/(Al, Ga, In)N article to part the sacrificial template from the (Al, Ga, In)N material and yield the free-standing (Al, Ga, In)N article.

The interfacial modification of the composite sacrificial template/(Al, Ga, In)N article to part the sacrificial template from the (Al, Ga, In)N material and yield the free-standing (Al, Ga, In)N article may be carried out in a wide variety of ways, as disclosed more fully hereinafter, e.g., by energizing the interface to decompose interfacial material and induce physical separation of the template from the (Al, Ga, In)N before the (Al, Ga, In)N material is cooled to ambient temperature from an elevated temperature of the (Al, Ga, In)N deposition on the template.

Alternatively, the modification of the interface may be carried out to effect parting of the (Al, Ga, In)N article from the template by heating and/or cooling of the interface, by laser beam impingement on the interface, by use of an interlayer that facilitates parting, by other decomposition of the interfacial material, by generating gas at the interface, by sound exposure of the interface, by e-beam irradiation of the interface, by rf coupling of the interface, by etching, by selective weakening of interfacial material, by selective embrittlement of interfacial material, by lateral fracturing at the interface region, or by other photonic, acoustic, physical, chemical, thermal or energetic processes.

The method may be carried out in situ or ex situ, in relation to the environment in which the (Al, Ga, In)N is deposited on the template, as described more fully hereinafter.

In one preferred embodiment, the interfacial modification includes impinging laser energy on the interface through either the sacrificial template or the (Al, Ga, In)N material of the composite article.

The interfacial modification may be conducted to effect parting of the sacrificial template from the (Al, Ga, In)N material either at elevated temperature, e.g., the growth temperature of the (Al, Ga, In)N material on the template, or subsequent to cooling of the composite sacrificial template/(Al, Ga, In)N article to ambient temperature or some other temperature below the growth temperature of the (Al, Ga, In)N material on the template. In this manner, the method of the invention may be carried out in situ, i.e., with the composite sacrificial template/(Al, Ga, In)N article maintained in the same environment in which deposition of the (Al, Ga, In)N material is carried out, or alternatively, the method of the invention may be carried out in an ex situ manner, in which the composite sacrificial template/(Al, Ga, In)N article is removed from the growth environment and subjected to interface modification for parting of the sacrificial template and (Al, Ga, In)N, in another environment.

In another aspect, the invention relates to a free-standing article produced by a method of the invention.

In a still further aspect, the invention relates to a composite sacrificial template/(Al, Ga, In)N article, including an interface between the sacrificial template and the (Al, Ga, In)N, wherein the article is at a temperature within 300° C. of the growth temperature of the (Al, Ga, In)N, and the interface contains absorbed laser energy.

As used herein, the term "ambient temperature" refers to temperature below 40° C., e.g., room (~25° C.) temperature.

As used herein, the term "interfacial material" refers to any of the following: sacrificial template material at the interface or in the vicinity thereof; undoped or doped (Al, Ga, In)N material at the interface or in the vicinity thereof, or one or more interlayer materials at the interface or between the sacrificial template and the (Al, Ga, In)N material.

The term "(Al,Ga,In)N" as used herein is intended to be broadly construed to include respective nitrides of the single species, Al, Ga, and In, as well as binary, ternary and quaternary compositions of such Group III metal species. Accordingly, the term (Al, Ga, In)N comprehends the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials.

Various other aspects, features and embodiments of the invention will be more fully apparent from the ensuing disclosure and appended claims.

BRIEF DESCRIPTION OF THE DRAWINGS

FIG. 1 is a schematic depiction of the heating of a (Al,Ga,In)N—template interface by laser radiation.

FIGS. 2–4 show the lasing of a composite sacrificial template/(Al, Ga, In)N article from the top to the bottom of the article (FIGS. 2 and 3) to form a parted sacrificial template and free-standing (Al, Ga, In)N single crystal wafer (FIG. 4).

DETAILED DESCRIPTION OF THE INVENTION, AND PREFERRED EMBODIMENTS THEREOF

Figures 5, 6, 7:
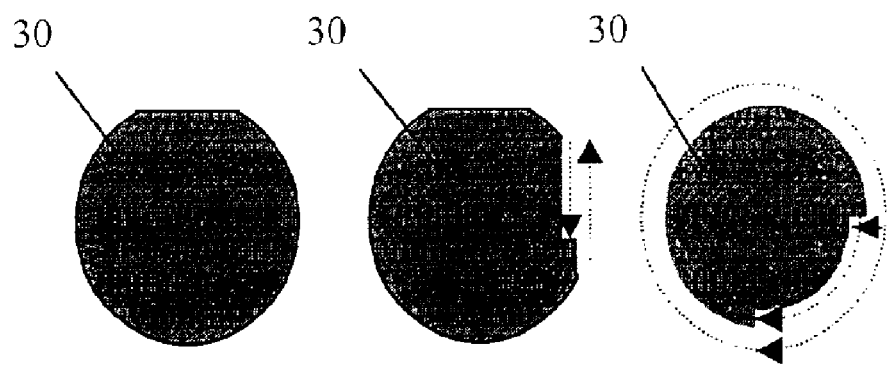
FIG. 5 is a top plan view of a composite sacrificial template/(Al, Ga, In)N article.
FIG. 6 is a corresponding view of the composite sacrificial template/(Al, Ga, In)N article of FIG. 5 during a rastering lasing operation, in which the laser beam is reciprocatingly traversed across the article, to effect interfacial separation of the sacrificial template from the (Al, Ga, In)N material, and yield a product (Al, Ga, In)N wafer article.
FIG. 7 is a corresponding view of the composite sacrificial template/(Al, Ga, In)N article of FIG. 6 during a perimeter lasing operation, in which the laser beam is translated in circular motion, beginning at the periphery of the article, and continuing successively in step-wise smaller-diameter circular arcs.

The disclosures of the following United States Patents and United States Patent Applications are hereby incorporated herein by reference in their respective entireties:

U.S. patent application Ser. No. 08/188,469 filed Jan. 27, 1994 in the names of Michael A. Tischler, et al., now issued as U.S. Pat. No. 5,679,152;

U.S. patent application Ser. No. 08/955,168 filed Oct. 21, 1997 in the names of Michael A. Tischler, et al.;

U.S. patent application Ser. No. 08/984,473 filed Dec. 3, 1997 in the names of Robert P. Vaudo, et al., now issued as U.S. Pat. No. 6,156,581;

U.S. patent application Ser. No. 09/179,049 filed Oct. 26, 1998 in the names of Robert P. Vaudo, et al.;

U.S. patent application Ser. No. 09/524,062 filed Mar. 13, 2000 in the names of Robert P. Vaudo, et al.;

U.S. patent application Ser. No. 09/605,195 filed Jun. 28, 2000 in the names of Jeffrey S. Flynn, et al.;

U.S. patent application Ser. No. 09/929,789 filed Aug. 14, 2001 in the names of Michael A. Tischler, et al.; and U.S. patent application Ser. No. 09/933,943 filed Aug. 21, 2001 in the names of Michael A. Tischler, et al.

The present invention relates in one aspect to a method of forming free-standing (Al, Ga, In)N material, including: providing an expitaxially compatible sacrificial template; depositing single crystal (Al, Ga, In)N material on the template; and parting the sacrificial template from the (Al, Ga, In)N material by modification of the (Al, Ga, In)N-template interface.

The modification of the interface may be carried out in any of numerous suitable ways, e.g., by heating the (Al, Ga, In)N-template interface before the (Al, Ga, In)N material is cooled to ambient temperature, by laser beam impingement of the interface, by use of an interlayer that facilitates parting, by decomposing interfacial material, by generating gas at the interface, by sound exposure of the interface, by e-beam irradiation of the interface, by rf coupling of the interface, by etching, by selective weakening of interfacial material, by selective embrittlement of interfacial material, by lateral fracturing at the interface region, or by other photonic, acoustic, physical, chemical, thermal or energetic processes. Acoustic processes may include sonic energy being directed at the interface, to which the interfacial material is preferentially susceptible for parting thereof, e.g., via an interlayer of specific sound energy-absorbing type. Chemical processes may include photodegradation of interfacial material, such as a photosensitive material disposed at the interface, which under photo-excitation conditions releases free-radicals to catalyze an interfacial decomposition reaction, or chemical etching where the interfacial material is preferentially susceptible to an etchant introduced in the environment of the sacrificial template/(Al, Ga, In)N composite article. A wide variety of methods for parting the sacrificial template from the (Al, Ga, In)N material in the sacrificial template/(Al, Ga, In)N composite article, will be apparent to those skilled in the art on the basis of the disclosure herein.

In the method of the invention, the (Al,Ga,In)N deposition can be carried out by any suitable process, including, without limitation, hydride vapor phase epitaxy (HVPE), metalorganic vapor phase epitaxy (MOVPE), chemical vapor deposition (CVD), and molecular beam epitaxy (MBE). U.S. Pat. No. 5,679,152, U.S. Pat. No. 6,156,581, U.S. patent application Ser. No. 09/179,049 and U.S. patent application Ser. No. 09/524,062 describe methods of forming (Al,Ga,In)N single crystal material with sufficient thickness to be self-supportive (i.e., free-standing) after parting from the template.

The free-standing (Al, Ga, In)N articles produced by the method of the present invention are suitable for use as substrates for the fabrication of microelectronic and/or optoelectronic devices or device precursor structures thereon. The free-standing (Al, Ga, In)N articles of the invention have three dimensional (x,y,z) character, and in one embodiment of the invention, each of the dimensions x, y is at least 100 micrometers and the direction z is at least 1 $\mu$m. In another preferred embodiment of the invention, the single crystal free-standing (Al, Ga, In)N article is of cylindrical or disc-shaped form, with diameter d and thickness z, where d is at least 100 $\mu$m and z is at least 1 $\mu$m. In a particularly preferred embodiment, each of the dimensions d and z is at least 200 micrometers. In yet another embodiment, the single crystal free-standing (Al, Ga, In)N article has a thickness dimension z of at least 100 micrometers, and a diameter dimension which is at least 2.5 centimeters.

As discussed in the background section hereof, one particular advantage of removing the sacrificial template before cooling to ambient temperature, is that defects and cracking induced by TCE-differences is alleviated. To maximize this benefit it is beneficial to perform the parting operation within ±300° C. of the growth temperature. However, the parting temperature may also be controlled at the growth temperature, a temperature less than the growth temperature or a temperature greater than the growth temperature in order to manipulate TCE-differences and minimize (or control) thermal stresses in the material. Other conditions (e.g. pressure) of the growth process may be selectively controlled in the parting step as appropriate and as readily determinable by those skilled in the art on the basis of the disclosure herein.

In the parting process, the (Al,Ga,In)N-template interface is locally heated to induce decomposition of one material, leading to separation of the two materials (the template material and the (Al,Ga,In)N material).

A preferred method of heating the (Al,Ga,In)N-template interface is use of laser radiation, as schematically shown in FIG. 1. The composite structure 10 comprises a sacrificial template 12 on which a (Al,Ga,In)N material 16 is grown, the template material and the (Al,Ga,In)N material forming an interface 14 therebetween. A coherent light beam 20 produced for example by a Nd:YAG laser (not shown in FIG. 1) is transmitted through the sacrificial template 12, which is transparent to the chosen laser radiation, and impinges on the (Al, Ga, In)N material, which is opaque to the chosen laser light ($3^{rd}$ harmonic of Nd:YAG (355 nm) is absorbed in AlGaInN materials with Eg <3.49 eV), at an impingement region 18 of the interface 14. The absorption of the laser energy in the opaque (Al, Ga, In)N material at its interface with the sacrificial template, causes chemical and/or physical change of material at the interface. The resulting deterioration of the interfacial material effects separation of the sacrificial template from the (Al,Ga,In)N material.

In one illustrative embodiment, the sacrificial template is formed of sapphire, and a high energy laser beam is directed through the sapphire and absorbed in the (Al,Ga,In)N material, at sufficient beam power density to induce thermal decomposition in a thin interface layer of the (Al,Ga,In)N so that the (Al, Ga, In)N is released from the template as a free-standing (Al,Ga,In)N crystal. In this embodiment, the light source has an energy greater than the bandgap of the (Al,Ga,In)N material so that it is efficiently absorbed, but less than the bandgap of the sapphire so that the light transmits through the sapphire. For example the $3^{rd}$ harmonic of a Nd:YAG laser (355 nm) is suitable for GaN-sapphire system with a parting threshold of greater than 150 mJ/cm$^2$ at 1000° C. The threshold laser power (which induces thermal decomposition or other physical and/or chemical degradative change) depends on many factors, including, but not limited to, the beam size and power distribution, the wavelength and absorption of the laser energy, the temperature at which parting is carried out, and the decomposition temperature of the material that is decomposing.

The primary laser beam characteristics usefully employed to achieve adequate parting of the (Al, Ga, In)N and template layers are:

(i) laser photon energy greater that is greater than the bandgap of one of the (Al,Ga,In)N and sacrificial template materials, and less than the bandgap of the other material;

(ii) laser power density that is sufficiently high to induce chemical and/or physical change of the interface material, so as to at least weaken interfacial adhesion of the respective template and (Al, Ga, In)N materials;

(iii) short pulsing of the applied radiation to reduce thermal diffusion deeper into the material (beyond the interface), reduce the shock wave that emanates from the absorbed laser energy, and generally decrease the amount of physical and/or chemical changes in the product (Al, Ga, In)N material, thereby minimizing damage to the single crystal (Al, Ga, In)N product material;

(iv) in conjunction with pulsing of the applied radiation, and optional scanning of the applied radiation beam on the composite sacrificial template/(Al, Ga, In)N article, utilizing a pulse rate that is effective to part the crystal area; and (v) although most beam profiles will work (Gaussian, Top Hat, etc,) a uniform, cylindrically symmetric and gradual transition from high (beam center) to low (beam edge) energy is desirable.

In respect of the beam profile, the better the beam quality (better collimated and closer to an ideal Gaussian beam profile) that is used, the longer the beam can retain suitable shape when passing through optics or traveling before reaching the sample. This factor is important, for example, if it is necessary or desired to locate the laser at a significant distance from the growth reactor or to use one laser unit to accommodate a multiplicity of (Al, Ga, In)N growth chambers (reactors). Beam homogenizers or diffusers located close to the composite sacrificial template/(Al, Ga, In)N article (wafer) can be used to make the edge of the beam profile less distinct. A roughened quartz or matte finish at the backside of the template can be used to accomplish optional beam homogenization of the lasing energy that is focused on the composite sacrificial template/(Al, Ga, In)N article.

To separate areas larger than the beam diameter, the laser beam can be scanned across the composite sacrificial template/(Al, Ga, In)N article, as shown in FIGS. 2, 3 and 4.

Scanning is best accomplished by providing a pathway for the released gases (produced by decomposition of the interface material, as a result of the impingement of the applied radiation) to escape from the composite sacrificial template/(Al, Ga, In)N article. The thermal decomposition of (Al,Ga, In)N under applied laser energy will release $N_2$ as a decomposition reaction product. $N_2$ that is trapped at the interface, however, will induce non-uniform stresses that can cause cracking. Therefore, scanning advantageously is started at the edge of the wafer and progressed inwardly, so that released nitrogen readily escapes.

FIG. 2 shows a composite sacrificial template/(Al, Ga, In)N article 10 in which the coherent light beam 20 transmitted through the sacrificial template 12, is translated from the top of the article 10 downwardly in the direction indicated by arrow A, so that the impinged region 18 has been decomposed to form a channel. As the light beam 20 moves down the interface 14, the $N_2$ formed as a decomposition product escapes through the channel of the impinged region 18, out of the sacrificial template/(Al, Ga, In)N article 10.

FIG. 3 shows the sacrificial template/(Al, Ga, In)N article 10 as the coherent light beam 20 is completing its traverse at the bottom edge of the article, completing the decomposition of the interface 14, and releasing the sacrificial template 12 from the (Al, Ga, In)N layer 16 so that the latter forms a free-standing (Al, Ga, In)N wafer product article, as shown in FIG. 4.

The scan pattern of the laser beam during the impingement effecting parting of the sacrificial template and the (Al, Ga, In)N material involves translational movement of the laser beam in a predetermined pattern appropriate to the parting operation. For example, the laser beam can be conveniently rastered back and forth, and/or translated in a perimeter pattern (which is a circular pattern for most wafers). The rastering is accomplished by physically moving the wafer, by deflecting the laser beam, or a combination of both. Step sizes between laser pulses in a pulsed laser irradiation of the sacrificial template/(Al, Ga, In)N interface can be from about 1 to about 200% of the laser beam spot size on the interface, but are more preferably from about 10 to about 50% of the laser spot size above the parting threshold.

Although strain is minimized by performing the laser parting near the growth temperature of the (Al, Ga, In)N material on the sacrificial template, it is also possible in the broad practice of the invention to perform the laser parting operation at lower temperature below the growth temperature, e.g., at ambient temperature. For irradiation of the sacrificial template/(Al, Ga, In)N interface to effect parting of the template and (Al, Ga, In)N materials at temperatures substantially below the growth temperature, laser scanning along (Al,Ga,In)N crystal planes reduces cracking from residual strain. Such scanning along crystal planes may be important at elevated temperatures, but it is more important under conditions where the composite is under stress.

As an example, for c-plane GaN grown on c-plane sapphire, scanning along a <11$\bar{2}$0> plane of the GaN reduces the incidence and extent of cracking when laser parting is carried out after the sacrificial template/(Al, Ga, In)N article is cooled to room ambient temperature and reheated to temperature in the vicinity of the growth temperature. Scanning parallel to the a-plane of (Al,Ga,In)N or along a low index surface is generally desirable.

Although beam scanning is useful, single beam pulse parting of complete samples may be done if a laser with sufficiently large beam size and power density to cover the sample area is available.

FIG. 5 is a top plan view of a composite sacrificial template/(Al, Ga, In)N article 30.

FIG. 6 is a corresponding view of the composite sacrificial template/(Al, Ga, In)N article during a rastering lasing operation, in which the laser beam is reciprocatingly traversed across the article, to effect interfacial separation of the sacrificial template from the (Al, Ga, In)N material, and yield the product (Al, Ga, In)N wafer article.

FIG. 7 is a corresponding view of the composite sacrificial template/(Al, Ga, In)N article during a perimeter lasing operation, in which the laser beam is translated in circular motion, beginning at the periphery of the article 30, and continuing successively in step-wise smaller-diameter circular arcs, as shown.

The laser parting process requires that the laser light reach the interface between the (Al,Ga,In)N and template materials. To accomplish this, the laser radiation must transmit through one of the (Al,Ga,In)N and template materials and be absorbed in the other one of such materials. For (Al,Ga,In)N growth, the path of the laser radiation depends on the nature of the sacrificial template.

If, for example, the template is a material such as sapphire having a larger bandgap than (Al,Ga,In)N, the laser light can be transmitted through the sapphire (referred to as the backside layer or material, since this "side" is the "back" or backing layer during the growth process) and the (Al,Ga,In)N material absorbs the laser beam.

However, when the template has a lower bandgap (e.g., Si, GaAs, SiC, InP, lower bandgap (Al,Ga,In)N, etc.) than (Al,Ga,In)N, the laser beam can transmit through the (Al,Ga,In)N material and be absorbed in the sacrificial template. The absorbed light causes heating which can act to chemically change either material. In general, templates with larger bandgap energy than the (Al,Ga,In)N material would be backside illuminated. Illustrative material of construction for the sacrificial template include, without limitation, sapphire, larger bandgap (Al,Ga,In)N, spinet, etc.

Alternatively, one or more interlayers may be employed to absorb light at the (Al,Ga,In)N/template interface. Suitable materials for such interlayers include materials that more readily decompose with heating of adjacent layers, to improve or seed (Al,Ga,In)N growth, or a combination thereof. If a laser energy-absorbing layer with a bandgap smaller than the bandgap of the (Al,Ga,In)N layer and the template is used, the laser light can pass through either surface of the composite sacrificial template/(Al, Ga, In)N article. For example, a 10 micron InGaN layer may be grown on the sapphire surface and then a thick GaN layer grown upon the InGaN. Light that is readily absorbed in the InGaN layer for purposes of effecting a chemical or physical change to the InGaN layer will also easily pass through the GaN or sapphire layer.

One may also form an interlayer through heavily doping the (Al, Ga, In)N layer to effectively reduce the bandgap. For example, the dopants Si, O or Ge may be used to create a heavily n-type doped (Al, Ga, In)N layer that will more readily absorb incident radiation. Alternatively, the dopants Mg, Zn, Be may be used to create a heavily p-type doped (Al, Ga, In)N layer that will more readily absorb incident radiation. For this purpose, dopant concentrations in excess $1\times10^{18}$ cm$^{-3}$ are preferred. A highly defective region, such as may be found in GaN on sapphire, can provide a reduction in the bandgap.

The backside or frontside illuminated templates may be uniform or alternatively they may be patterned to permit laser parting in specific areas. Patterning of the sacrificial template, or use of patterned interlayers, may for instance be employed to facilitate lateral epitaxial overgrowth (LEO), as a technique for defect reduction, or to facilitate slip or cracking in a preferred direction.

Interlayers can be chosen, for example, so that they can be selectively etched or decomposed, to separate the grown (Al, Ga, In)N from the sacrificial template. Alternately, interlayers can be chosen to couple to a heating source or otherwise to facilitate chemical or physical changes that facilitate parting of the (Al,Ga,In)N material.

Figures 8, 9:
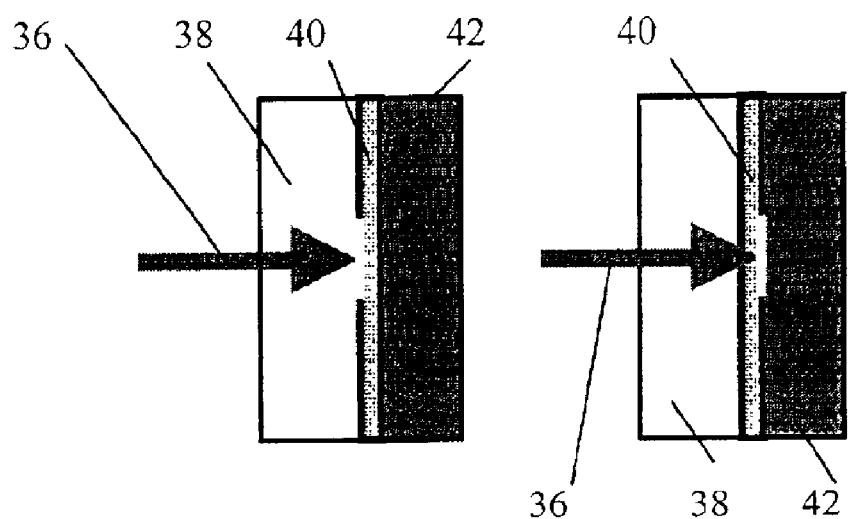
FIG. 8 is a schematic depiction of a composite sacrificial template/interlayer/(Al, Ga, In)N article in which impinging laser energy is absorbed by the interlayer to effect decomposition thereof and release the sacrificial template layer from the (Al, Ga, In)N layer.
FIG. 9 is a schematic depiction of a composite sacrificial template/interlayer/(Al, Ga, In)N article in which impinging laser energy absorbed by the interlayer induces degradation of the (Al, Ga, In)N material adjacent thereto, to effect separation of the sacrificial template from the (Al, Ga, In)N product layer.

FIG. 8 for example is a schematic depiction of a composite sacrificial template/(Al, Ga, In)N article including sacrificial template layer 38 and (Al, Ga, In)N layer 42, separated by interlayer 40, wherein laser beam 36 is impinging on the interlayer to effect decomposition of the interlayer and release the sacrificial template layer 38 from the (Al, Ga, In)N layer 42.

FIG. 9 is a schematic depiction of a composite sacrificial template/(Al, Ga, In)N article including sacrificial template layer 38 and (Al, Ga, In)N layer 42, separated by interlayer 40, wherein laser beam 36 impinging on the interlayer is absorbed by the interlayer. In this embodiment, however, the laser beam energy absorbed by the interlayer induces decomposition of the (Al, Ga, In)N material that is adjacent to the interlayer. Such decomposition of the (Al, Ga, In)N material releases the sacrificial template layer 38 from the (Al, Ga, In)N layer 42.

In the parting process, the requirement that the light be transmitted to the (Al,Ga,In)N-template interface means that the laser must be directed to the interface either from the (Al,Ga,In)N side or template side of the composite sacrificial template/(Al, Ga, In)N article, depending on the template material and laser. The template material and the laser energy employed for the parting are therefore desirably selected so that the pathway for the laser beam, through the template (for template-side lasing of the composite sacrificial template/(Al, Ga, In)N article) or through the (Al, Ga, In)N material (in the case of (Al, Ga, In)N-side lasing of the composite sacrificial template/(Al, Ga, In)N article) does not significantly hinder (absorb or reflect) the beam. For example, if a UV laser is employed for template-side lasing of the composite sacrificial template/(Al, Ga, In)N article, then the template is desirably highly transparent to the UV radiation produced by the laser.

The laser beam pathway through the room ambient (the environment between the generated laser beam and the composite sacrificial template/(Al, Ga, In)N article must also be considered in ensuring that the beam impinged on the article is of suitable character (intensity) to effect parting of the template and (Al, Ga, In)N. Further, the incident angle of the laser beam must not be so shallow that the light is reflected by intervening surfaces.

In one illustrative embodiment, a UV laser is employed, and UV transparent quartz is usefully employed directly at the backside of the composite sacrificial template/(Al, Ga, In)N article and transmits the UV laser radiation. Alternately, sapphire, AlN or other materials transparent to the light used for parting can be used, but these materials must also be compatible with their location in the growth chamber (reactor). The composite sacrificial template/(Al, Ga, In)N article, for example, may be disposed in an HVPE reactor and may be exposed to corrosive gases and high temperatures and the template material must therefore be compatible (e.g., retain structural integrity for supporting the (Al, Ga, In)N material being grown thereon, as well as transmissivity for the lasing energy being directed to the interface region of the composite article) with the reactor environment.

Figure 10:
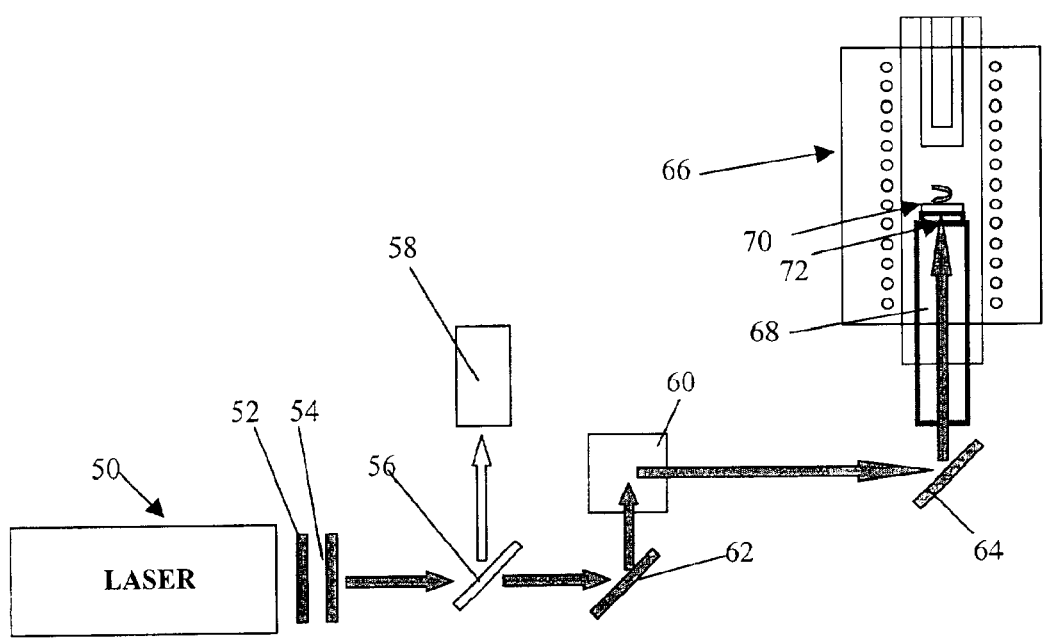
FIG. 10 is a schematic illustration of an apparatus for conducting growth of (Al,Ga,In)N by HVPE and transmission of laser light to the composite sacrificial template/(Al, Ga, In)N article from the backside of the composite (through the template).

FIG. 10 is a schematic illustration of an in situ laser parting apparatus for conducting growth of (Al,Ga,In)N by HVPE and transmission of laser light to the composite sacrificial template/(Al, Ga, In)N article from the backside of the composite (through the template).

In the FIG. 10 system, the laser 50 is arranged with a waveplate 52 and polarizer 54 for power modulation to provide radiation of appropriate character for the parting. The laser beam is shown in FIG. 10 by the large schematic arrows. The beam may be measured as to its power by mirror 56 and associated energy meter 58, which are in place only during power measurement. The power measurement may therefore be employed to characterize the laser beam so that appropriate waveplate 52 and polarizer 54 positions/settings are utilized for power modulation.

The laser beam in normal operation during parting impinges on the mirror 62 and is reflected to the x-y scanner 60. The x-y scanner 60 selectively translates the laser beam, directing it to mirror 64 from which it is directed through the pedestal 68 mounted in the (Al, Ga, In)N growth reactor 66. The composite wafer article is disposed on the pedestal 68 and comprises (Al, Ga, In)N layer 70 grown on the sacrificial template 72.

The sacrificial template is transparent to the laser beam, so that the beam passing through the pedestal 68 then is transmitted through the sacrificial template 72 to the template/(Al, Ga, In)N interface. The laser energy is absorbed at the interface to effect parting of the sacrificial template 72 from the (Al, Ga, In)N material, to yield (Al, Ga, In)N material in the form of a free-standing (Al, Ga, In)N single crystal article.

The growth reactor 66 may be constructed and arranged to carry out HVPE as above discussed, or alternatively, a growth reactor constructed and arranged for another (Al, Ga, In)N growth process may be employed, e.g., to carry out MOVPE, CVD, MBE or method or technique known in the art for deposition/growth of (Al, Ga, In)N materials on substrates.

In the FIG. 10 system, arranged for scanning by means of the x-y scanner 60, the pathway of the laser beam is unobstructed for the entire cross-sectional area of the composite sacrificial template/(Al, Ga, In)N article on the pedestal 68. This in turn requires a pedestal with a suitably large cross sectional area, so that the beam can be scanned through the entire growth area of the (Al, Ga, In)N layer formed on the template. Alternately, the composite sacrificial template/(Al, Ga, In)N article on the pedestal can be rotated and moved to part the entire growth area of (Al, Ga, In)N material. Laser deflection and wafer movements can also be combined (e.g., rotation of the composite sacrificial template/(Al, Ga, In)N article may be effected, with the laser beam deflected to scan from edge to center). To control heat loss out of the large pedestal opening, one or more transparent baffle plates can be placed at the lower end of the pedestal.

The pedestal 68, since it is utilized as a support structure for the composite sacrificial template/(Al, Ga, In)N article, is preferably highly transparent to the laser beam. In the case of ultraviolet lasers, the pedestal may for example be formed of a UV transparent quartz to enable light to be transmitted to the composite sacrificial template/(Al, Ga, In)N article. Such quartz material preferably is bubble-free and contains minimal particulates, in order to be non-absorbent of the incident laser radiation. Alternative materials of construction that are transparent, or at least highly transmissive, to UV radiation (such as sapphire, AlN, etc.) could alternatively be employed. For other types of laser radiation (e.g., infrared, xenon excimer, $CO_2$, or any other electromagnetic beam or radiation of suitable wavelength), suitable materials of construction for the pedestal can readily be determined within the skill of the art.

The use of transparent backside materials in the composite sacrificial template/(Al, Ga, In)N article have an additional advantage in that the growth process can be directly monitored during deposition of (Al, Ga, In)N on the sacrificial template, and such monitoring can be employed to control the growth process via feedback control means and techniques. Such feedback loop operation is readily implemented, as part of an overall process control subsystem for the (Al, Ga, In)N growth and in situ parting system.

The surface of the pedestal or other reactor wall material, or even the sacrificial template back surface of the composite sacrificial template/(Al, Ga, In)N article, may be modified to shape the light beam being transmitted to the sacrificial template/(Al, Ga, In)N interface of the composite article. For example, such surface(s) may be roughened to diffuse the incident beam, or they may be shaped into a series of microlenses to facilitate focusing in specific areas, or they may be masked to prevent illumination in some areas.

In the assembly of the (Al, Ga, In)N growth and parting system, appropriate care should be taken with optics choice and placement, so that they are compatible with the laser wavelength and so that they minimize rejections during the operation of the laser to part the sacrificial template and (Al, Ga, In)N materials from one another. Reflections are preferably minimized since they may cause interference or adverse variation in the beam profile. Interference fringes may also be employed to perform the parting with stripes of light, as a partial release technique discussed more fully hereinafter.

In the (Al, Ga, In)N growth and parting system, the growth reactor is suitably constructed of materials that are compatible with the growth environment, which may by way of example include growth conditions of temperatures of up to 1200° C., the presence of vapor phase reagents such as $NH_3$, HCl, and GaCl, and pressure levels that may variously be subatmospheric, superatmospheric, or atmospheric pressures.

In carrying out the parting operation using backside illumination, the template upon which the (Al,Ga,In)N is grown must be transparent to the laser radiation, as previously discussed, and the backside of the template and composite wafer article holder (e.g., the pedestal and any wafer mount or positioning elements used therewith) must be maintained free from laser absorbing deposits such as backside (Al,Ga,In)N.

Various approaches to preventing backside deposits are advantageously employed.

By way of example, the illustrative system schematically depicted in FIG. 10 is designed to enable the wafer to stay in the same position for growth and template removal. Such arrangement minimizes temperature change between the growth and template removal operations. The growth and template removal process may also be carried out by growing the (Al, Ga, In)N layer on the sacrificial template in one or several chambers or portions of the reactor and transporting the resulting composite wafer article to a separate template removal chamber or area. The composite wafer article may be heated during transport to minimize temperature change.

The template removal operation may be carried out by directing laser light to the frontside of the composite sacrificial template/(Al, Ga, In)N article, in a corresponding manner to the backside illumination approaches discussed hereinabove, using an appropriate laser (and wavelength of lasing energy) to transmit the laser beam through the (Al, Ga,In)N and thermally decompose an interlayer or template, for example.

As another approach to carrying out the parting step, several different interfacial layers with different stoichiometry (and therefore different bandgap) may be grown to enable the parting of several layers with a tunable laser.

As described above, the backside of the template and composite wafer article holder are preferably maintained free from laser absorbing deposits, and it is also beneficial to inhibit deposits on the side and the top surface edge of the composite article to facilitate the LILO process when employed in the practice of the present invention. If the same gases that deposit (Al,Ga,In)N material make their way to the back of the sacrificial template and react, the resulting deposits can prevent the laser beam from reaching the parting interface. To avoid such adverse consequence and minimize the occurrence of backside deposits, the following approaches may be employed.

In one approach, the composite wafer article may be fixedly held from the backside, by vacuum, electrostatic force or other means or techniques that do not block or severely attenuate the laser radiation and that hold the composite wafer article tightly enough against the flat composite wafer article holder to block growth gas flow from reaching the backside of the sacrificial template.

As another approach, the backside of the sacrificial template in the composite wafer article can be flushed with inert gas, to direct growth gas flow away from the back of the sacrificial template or to inhibit reaction at the back surface.

As still another approach, materials such as borosilicate glasses, which are transparent to the laser radiation, which soften or melt at growth and template removal temperatures, and which do not outgas significant impurities or react with the growth process gases, can be used to seal the backside from growth process gases (e.g., source reagent gases, product gases of the growth process, and any associated carrier, diluent, etc., gases). Suitable glasses may be provided in the shape of the composite wafer article, or the glasses can be coated on the backside of the sacrificial template before growth. Glass materials can also be used to alter stress and a glass of specific TCE can be correspondingly chosen to minimize stress or induce a desired stress in the composite wafer article. Glass materials may be used to cover the entire backside of the sacrificial template, or they can be utilized to cover the perimeter of the sacrificial template and thereby act as a seal.

In a further variant approach to preventing backside deposits, the backside of the sacrificial template and composite wafer article holder can be coated with a material which inhibits deposits, such as for example sputtered, evaporated, or plasma-enhanced chemical vapor deposition (PECVD)-applied $SiO_2$ or $Si_3N_4$. By minimizing adsorption of one or more of the growth gas species to the solid surfaces, unwanted deposits can be minimized. Alternatively, the inhibiting layer could be removed (e.g., by in situ etching or other technique for removal of the growth inhibiting layer) before parting, thereby removing any deposits that may be present, at the same time.

As a further approach to minimizing backside deposits, physical impediments to growth gas flow can be placed over the edges of the sacrificial template and composite wafer article, to block the path of gases and minimize deposits in undesirable areas. For example, cover plates may be utilized, having opening(s) that enable growth to occur at the frontside of the composite wafer article, but preventing significant growth from occurring on the backside of the composite wafer article. The cover plate is advantageously formed and deployed so that it enables laser light to reach the interface of the growth region while at the same time enabling release of gases that are produced in the parting operation. For example, grooves may be provided in the cover plate to provide a path for gas release.

The cover plate in one embodiment is advantageously tapered to provide a shadow effect and serve to reduce deposition of (Al,Ga,In)N on the cover plate during growth.

Figure 11:
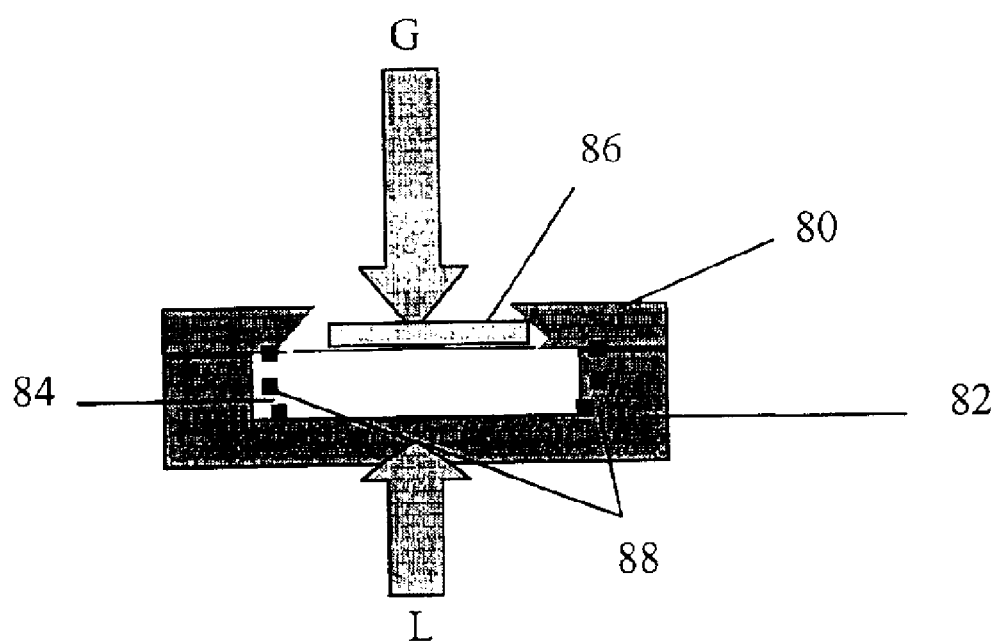
FIG. 11 is a schematic representation of a portion of a growth and parting system using a cover plate on a wafer holder.

FIG. 11 is a schematic representation of a portion of a growth and parting system using a cover plate 80 on a wafer holder 82. The sacrificial template 84 is disposed on the wafer holder 82, and the (Al, Ga, In)N material 86 is grown on the sacrificial template by delivery of the source gases in the gas flow stream indicated schematically in FIG. 11 by arrow G. The cover plate 80 is tapered as shown, so that deposits 88 of absorbing material produced in the growth process are localized in a manner that does not interfere with the transmission of laser energy to the interface between the sacrificial template 84 and the (Al, Ga, In)N material being grown on the template. By such arrangement, the laser beam, schematically represented in FIG. 11 by arrow L, is non-interferingly transmitted through the template to the interface. The cover plate thereby shadows the template from adverse growth effects, and the taper of the surface from the top opening of the cover plate (downwardly divergent passage profile) minimizes adherence of the (Al, Ga, In)N material to the cover plate.

Considering now the sacrificial template in greater detail, the top surface of the template, or an edge masking surface associated with the template, may be shaped in such a way to facilitate gas escape during the parting process while also inhibiting growth on the template surface. One means of accomplishing this is by deposition of an $SiO_2$ layer on the edge of the template surface and then patterning the $SiO_2$ layer to expose the template material, thereby forming trenches. If the aspect ratio (ratio of height of the trench to the width of the trench) is sufficiently high, little or no (Al, Ga, In)N will form in the trench. The trenches may for example be arranged to form an array of radial grooves to facilitate gas escape from the interface region. Alternatively, the patterning to form the trenches may be carried out so that the grooves are branched, to facilitate gas release during parting.

Performing the parting process in the same apparatus in which the growth is conducted, enables enhanced flexibility in the timing of the parting operation to be achieved, as well as facilitating control of the localized environment in which the parting operation is carried out.

If the parting is carried out at temperatures in excess of the decomposition temperature of the (Al,Ga,In)N material (e.g., 800° C. for GaN), cracked nitrogen (e.g., atomic N, or $NH_3$) can be introduced and maintained in the localized environment during parting, in order to protect the frontside of the composite wafer article from thermal decomposition. HCl can be added to the localized environment of the parting process to assist in removal of Group III elements left behind by the decomposition reactions at the interface.

In the parting operation, decomposition may occur at the backside of the composite wafer article and prevent light from reaching the interface. In this case, continuous laser operation and etching with HCl may be employed to clear a pathway to the interface. Otherwise, the parting environment may suitably be carried out in an environment such as $N_2$ atmosphere.

Under some circumstances, it may be beneficial to retain the Group III metal produced by interfacial decomposition reaction, if the region in which the metal is found has been successfully parted. The metal will reflect the laser light from the already parted region, preventing further damage to the interfacial region by the intense light exposure. By monitoring light reflected from the reflective surface, the lift-off progress may be monitored.

The pressure in the apparatus in which the parting is carried out can be controlled to balance the stress during parting. For example, subatmospheric conditions in the chamber in which parting is conducted, may help to effectuate gas release from the parting interface. In general, pressures in a range of from about $10^{-6}$ Torr to about $10^{10}$ Torr are compatible with and preferred in the parting process. Higher pressures may require higher decomposition temperatures (more aggressive heating or laser energies). In one embodiment, localized pressure in the parting operation may be >1000 Torr, particularly if the growth process was conducted at high pressure.

The thicknesses of the (Al,Ga,In)N material and template layer can be adjusted to minimize stress in the composite wafer article comprising the template and (Al, Ga, In)N materials. Stress is typically present in the (Al,Ga,In)N-template system at the growth temperature because of different material properties of the film and template. In general, thin sacrificial templates will develop stress defects and crack more readily than thicker layers, since relative stress accumulated in thinner layers will cause cracking, which functions to release the stress. Thicker sacrificial templates will bow less and are more readily reuseable.

Concerning the thickness of the (Al, Ga,In)N material, there is a balance between increased stress for large thicknesses and lack of rigidity and strength for small thicknesses. Stress present in the (Al,Ga,In)N-template system will increase with increasing (Al,Ga,In)N thickness due to various factors, including changes in material properties with increasing distance from the template. Uncracked thick films are more easily handled and sustain their shape without breaking.

The self-supporting nature of the product (Al,Ga,In)N material is dependent on the area of the free-standing material. Larger area (Al, Ga, In)N articles require relatively larger thicknesses to be self-supporting. The material quality of the product (Al,Ga,In)N, in general, improves with increasing thickness when grown on a foreign template ("foreign" in such context meaning heterogeneous to the (Al, Ga, In)N product material). By way of example, for fully parted product wafers having a 2" diameter, it is desirable for the thickness of the (Al,Ga,In)N material to be in excess of 50 $\mu$m before parting. However, thinner films can be partially parted and therefore partially supported by the sacrificial template. If the unparted area is <50% of the total area, thermal stresses induced by cooldown to ambient temperature (e.g., room temperature) can complete the parting process.

A weakened interface facilitating parting may also be created by inducing local heating of the composite template/(Al, Ga, In)N article at a temperature that is slightly less (e.g., <5° C. below) the thermal decomposition temperature (threshold temperature).

Alternatively, the parting can be assisted after growth by chemical or physical removal of the sacrificial template. It is also within the purview of the present invention to combine various approaches for parting the (Al, Ga, In)N and sacrificial template materials from one another, such as for example, by laser parting in combination with chemical etching, or by other combinations of thermal/physical/chemical steps.

The timing of the parting process relative to the growth process can be varied to maximize material quality, manage the stresses produced in the material, and improve process manufacturability of the (Al, Ga, In)N free-standing single crystal product article. To manufacture individual (Al, Ga, In)N wafers, the parting process can be performed upon completion of the (Al,Ga,In)N growth, e.g., after 100 to 1000 $\mu$m of (Al,Ga,In)N have been grown on the sacrificial substrate. The parting can occur after growth is complete or during the growth process.

The flexibility of performing the parting during the growth process enables process variations to be effected, such as partially parting the materials at very thin (Al,Ga,In)N thickness and then continuing growth. Partial parting can facilitate stress release while enough material is retained to support the (Al,Ga,In)N material during growth. Since thermal decomposition incident to laser irradiation releases gaseous decomposition products at the interface, partial parting by use of lower laser power density, will reduce gas production and reduce cracking. The partially parted (Al, Ga,In)N may be completely removed upon completion of growth by further laser parting, by fracture of the unparted material during cooldown, or by other suitable thermal, mechanical and/or chemical means.

Alternatively, full parting can be carried out with (Al,Ga, In)N thicknesses greater than 20 $\mu$m over a small area. Subsequent heating (or laser operation) may be also employed to complete the parting or to part the materials again in the event that further growth reattaches the (Al,Ga, In)N to the template or reactor components.

The parting process may be repeated one or multiple times during the growth process and/or thereafter. As described hereinabove, HCl or other suitable reagent may be employed to remove excess Group III elelments (Al, In, Ga) present after decomposition that may block further laser transmission to the interface of the template/(Al, Ga, In)N article.

In addition to parting during growth, growth can be temporarily interrupted to carry out the parting operation. This sequence can also be repeated one or more times during a fall sequence of growth-parting alternating steps.

Since parting near the growth temperature releases the stresses associated with heteroepitaxy, growth can more readily be carried out for very large thicknesses of the product (Al, Ga, In)N material, in excess of 1–100 mm. The free-standing (Al,Ga,In)N product article can then be processed into individual wafers, in a manner as more fully disclosed in prior copending U.S. patent application Ser. No. 09/524,062 filed Mar. 13, 2000.

In general, the parting process is advantageously carried out upon completion of from about 0.01 to about 100 mm of growth, depending on the desired (Al, Ga, In)N product.

Although the parting process is most preferably and beneficially carried out at a temperature at or near the growth temperature, before cooling the reactor containing the template/(Al, Ga, In)N article to ambient temperature (e.g., room temperature), the parting processes can also be carried out after the template/(Al,Ga,In)N article has been cooled to ambient temperature.

In general, the parting operation can be conducted at any suitable temperature, as will be readily determinable within the skill of the art based on the disclosure herein.

Parting can be performed at elevated temperatures that are greater than, less than, equal to, or substantially equal to, the original temperature at which the (Al,Ga,In)N was grown on the sacrificial template. Parting is suitably carried out at temperatures that are, in order of increasing preference, within 400° C., within 300° C., within 250° C., within 200° C., within 150° C., within 100° C., within 75° C., and within 50° C., of the growth temperature of the (Al, Ga, In)N material on the template. An elevated temperature condition of the template/(Al, Ga, In)N composite article is advantageous to at least partially alleviate the TCE-stresses, so that parting at the elevated temperature condition produces a stress-free or substantially stress-free (Al, Ga, In)N free-standing article. Protection of the AlGaInN from thermal decomposition may be necessary, as for example may be effected with the use of an N-containing ambient environment.

As discussed hereinabove, deleterious light-absorbing or light-attenuating deposits are desirably not present on the illumination side of the template/(Al, Ga, In)N composite article, or on edges thereof, since such deposits interfere with the light transmission into the article that is required for laser parting. Backside deposits are preferably minimized with sputtered or PECVD $SiO_2$ or other growth inhibitors during the growth of (Al, Ga, In)N on the template. The inhibitor in such instances can be chemically removed before parting. Removal of the growth inhibitor layer has the added benefit of removing any backside deposits with it. $SiO_2$ thicknesses greater than 50 nm are preferred, and thicknesses greater than 300 nm are most preferred.

Prevention of backside deposits and deposits at the edges of the composite template/(Al, Ga, In)N article is advantageously carried out by methods described above for in situ parting (e.g., where parting is carried out in the reactor used to carry out the growth process). Ex situ parting may also be performed, wherein the composite template/(Al, Ga, In)N article is removed from the reactor to carry out subsequent parting. Ex situ parting removes the requirement, inherent in in situ parting, of not blocking the laser beam. Further, the use of ex situ parting entails additional flexibility in use and deployment of means to protect edge and backside portions of the composite template/(Al, Ga, In)N article.

Physically or chemically removing the edges of the composite template/(Al, Ga, In)N article after growth, to eliminate thick (Al,Ga,In)N growth at the edges of the composite article, may also be used as a processing technique to prevent such adhered areas from causing cracking of the product (Al, Ga, In)N article. Physical techniques for such excess growth removal may for example include, without limitation, grinding, cutting, or cleaving along crystalline planes. Chemical removal of such excess growth may be accomplished by etching (in $H_3PO_4$ or in HCl) or with UN light-assisted etching of the deposits, where UV light focused on particular areas increases the rate and extent of the etching.

Laser parameters for impingement of laser energy on the interface of the composite template/(Al, Ga, In)N article in ex situ parting are similar to those used for in situ parting.

Scanning patterns, including initiation of scanning at the edges of composite template/(Al, Ga, In)N articles, are particularly important for release of effused gases in ex situ parting. Since more strain is present in the composite template/(Al, Ga, In)N article in ex situ parting, scanning along crystal planes is more important than for scanning to effect in situ parting. Single beam parting is advantageously employed in instances where lasers are available with sufficient beam size and beam power density to part the entire area, without scanning being necessary.

(Al,Ga,In)N layers that are too thin to be self-supporting, can be supported by gravity or by bonding to a suitable physical support structure before parting.

Ex situ parting has the advantage of ready access to the frontside and backside of the composite template/(Al, Ga, In)N article. The directional accessibility increases the degrees of freedom for choice of templates and interlayers for ex situ parting operations.

In both in situ and ex situ parting operations, interlayers that reduce strain and cracking are highly advantageous. The interlayer may be provided on the sacrificial template prior to introduction of the template to the growth reactor, or alternatively, the interlayer may be applied in situ in the growth chamber prior to the inception of active growth of the (Al, Ga, In)N material.

Subthreshold/partial parting of thin layers may be employed in the broad practice of the invention, to provide residual surface artifacts as seeds for subsequent growth. Subthreshold/partial parting of thick layers followed by chemical etching of the weakened interface also may be utilized as a technique to improve process yield.

Gases released from the interface during the parting can cause film cracking, reducing process yield. Using lower power density reduces the amount of gas released, and reduces the probability of wafer cracking during the parting process.

After parting, the (Al, Ga, In)N article may need to be cleaned to remove residual Group III metals resulting from the interfacial decomposition. Acids such as HCl or HF, employed at room temperature or elevated temperature, are effective for this purpose.

To avoid thermal shocking of the (Al,Ga,In)N material after parting or partial parting, a slow cooling process, at a rate <20° C./min. is desirable, although more rapid cooling can be used to improve manufacturability. The cooling rate appropriate to obtain a given end product (Al, Ga, In)N article of desired character may readily be determined without undue experimentation, by empirical variation of time-temperature schedules, and morphological characterization and end use testing of the (Al,Ga,In)N product article.

Although the invention has been primarily described herein in terms of use of laser-induced parting, other forms of targeted interface heating can be used (e.g., using heat, sound, e-beam irradiation, rf coupling, or multiple photon processes (e.g., carried out at 2 different wavelengths of laser radiation, or by UV flooding in combination with use of a targeted laser, etc.). Physical or chemical changes at the interface can be induced at the intersection of 2 or more photon/radiation sources, the combination of which are needed to effect the modification and parting. Multiple photon processes are more fully described in the following references: (see, for example, Misawa, Hiroaki; Juodkazis, Saulius; Sun, Hong-Bo; Matsuo, Shigeki; Nishii, Junji, Formation of photonic crystals by femtosecond laser microfabrication, Proc. SPIE-Int. Soc. Opt. Eng. (2000), 4088(Laser Precision Microfabrication), 29–32; Kuebler, Stephen M.; Cumpston, Brian H.; Ananthavel, Sundaravel; Barlow, Stephen; Ehrlich, Jeffrey E.; Erskine, L. L.; Heikal, Ahmed A.; McCord-Maughon, D.; Qin, J.; Rockel, H.; Rumi, M.; Marder, S. R.; Perry, J. W., Three-dimensional micro-fabrication using two-photon-activated chemistry, Proc. SPIE-Int. Soc. Opt. Eng. (2000), 3937(Micro- and Nano-photonic Materials and Devices), 97–105; Sun, Chi-Kuang; Huang, Yong-Liang; Liang, Jian-Chin; Wang, Jiun-Cheng; Gan, Kian-Giap; Kao, Fu-Jen; Keller, Stacia; Mack, Michael P.; Mishra, Umesh; Denbaars, Steven P., Large near resonance third order nonlinearity in GaN, Opt. Quantum Electron. (2000), 32(4/5), 619–640; and Neogi, Arup; Yoshida, Haruhiko; Mozume, Teruo; Georgiev, Nikolai; Akiyama, Tomoyuki; Wada, Osamu, Intersubband-transition-induced interband two-photon absorption by femtosecond optical excitation, Proc. SPIE-Int. Soc. Opt. Eng. (2000), 3940 (Ultrafast Phenomena in Semiconductors IV), 91–97.

Although localized interface heating has been described herein as an approach for altering the physical and chemical nature of the interface of the composite template/(Al, Ga, In)N article, the invention is intended to be broadly construed as including any means or methodology for effecting a physical or chemical change at the interface that facilitates parting of the (Al,Ga,In)N material from the sacrificial template. For instance, implantation techniques, e.g., ion implantation, to create a weakened region for fracture is contemplated in the broad practice of the invention. Alternatively, heating or excitation of the entire sample uniformly (not just locally at the interface), but including an intermediate layer which weakens at a lesser level of heating or excitation is intended to be comprehended by the present invention. As a still further alternative, the use of processes or interlayers that make the interface more chemically reactive, such that the interface region can be easily etched away, including etching before the composite template/(Al, Ga, In)N article is cooled to room ambient, is contemplated in the broad scope of the present invention.

Although single (Al,Ga,In)N layers and (Al,Ga,In)N layers with intermediate layers have been described, the present invention is not thus limited, and the (Al, Ga, In)N product article may also include, or have associated therewith, further epitaxial layers, device structures, device precursors, other deposited materials, or devices made from such materials, so long as they do not preclude interfacial processing to effect delamination of template and (Al, Ga, In)N portions of the composite template/(Al, Ga, In)N article. These aforementioned layers, structures, precursors, and materials, may be deposited before or after the parting has been performed, as necessary and/or appropriate to the end use of the (Al, Ga, In)N article. Systems containing these structures are also contemplated in the broad practice of the invention.

In addition, although the invention has been primarily described herein with reference to (Al,Ga,In)N materials on sacrificial templates, the present invention is intended to broadly encompass heterogeneous composite material structures having an interface between discrete phases or types of materials, in which the interface is susceptible of energetic or other modification to part the material at the interface region into discrete constituent parts, including composite material structures that may be processed at elevated temperature for interface modification to interfacially delaminate the composite body into constituent parts, or corresponding composite material structures that are interfacially delaminated at ambient temperature after elevated temperature processing and cool-down.

The features and advantages of the invention are more fully shown by the following examples.

EXAMPLE 1

Free-standing GaN of 400 μm thickness was produced by HVPE growth of GaN on sapphire, and laser parting of the composite GaN/sapphire article in the growth chamber near the HVPE growth temperature.

In this process, a sacrificial (0001) sapphire wafer was loaded into the growth chamber of an HVPE reactor. The sapphire was heated to approximately 1000° C., and the surface of the sapphire was exposed to GaCl gas and $NH_3$ gas for 165 minutes. The GaCl was formed by HCl flowing over molten Ga. The $NH_3$/HCl ratio was 23.

The GaCl flow was terminated, and the GaN-sapphire composite was controlled near the growth temperature and at atmospheric pressure, with $NH_3$ flow maintained to protect the GaN surface.

Parting radiation for interfacial delamination of the GaN and sapphire layers was generated by a Nd:YAG laser. The $3^{rd}$ harmonic of the Nd:YAG laser was adjusted to 90 mJ, using a laser power meter and waveplate-polarizer combination. The laser radiation was directed to the GaN-sapphire interface through a UV-transmissive quartz pedestal and the sapphire template.

During the irradiation, the GaN-sapphire composite was rotated and the laser beam was electro-optically modulated to scan the beam from edge to center until the entire wafer area was exposed.

The GaN and sapphire were cooled to room ambient.

Freestanding GaN and sacrificial sapphire were removed from the growth chamber. The resulting freestanding GaN material was approximately 400 μm in thickness, visibly transparent and crack-free, had a dislocation density less than $10^7$ cm$^{-2}$ and a (0004) double crystal x-ray rocking curve halfwidth of less than 200 arcsec.

EXAMPLE 2

In this example, a 40 mm diameter freestanding GaN wafer was produced by HVPE growth of GaN on sapphire, and laser parting at elevated temperature.

The following process steps were carried out:

(1) The backside of a (0001) sapphire wafer was sputter-coated with 300 nm of $SiO_2$. The edges of the wafer simultaneously received some coating, but $SiO_2$ was prevented from depositing on frontside (growth side) of the wafer.

(2) This sputter-coated sacrificial (0001) sapphire wafer was loaded into the growth chamber of a horizontal HVPE reactor.

(3) The sapphire was heated to approximately 1000° C., and the surface of the sapphire was exposed to GaCl gas and $NH_3$ gas for 180 minutes, using GaCl generated by flowing HCl over molten Ga, at a $NH_3$/HCl ratio of 35 in the process.

(4) The GaCl flow was terminated.

(5) The NH3 flow was terminated.

(6) The GaN/sapphire composite was removed from the growth chamber.

(7) Following its removal from the growth chamber, the GaN/sapphire composite remained at room ambient temperature for a period of days.

(8) GaN deposits located at the sapphire side and on the edge of the GaN-sapphire composite were removed by a combination of HF etching of the $SiO_2$ for several hours and physical grinding.

(9) The GaN/sapphire composite was loaded into a vacuum chamber with the GaN surface situated within a bed of SiC particles.

(10) A 1 cm thick quartz disc was placed on the GaN/sapphire composite with the roughened surface (matte finish) placed closest to the GaN/sapphire to homogenize the laser beam.

(11) The vacuum chamber was evacuated and filled with $N_2$ gas.

(12) The GaN/sapphire composite was heated to approximately 900° C.

(13) Radiation from the $3^{rd}$ harmonic of a Nd:YAG laser was adjusted to 100 mJ using a laser power meter and waveplate-polarizer combination, and then the laser radiation was directed to the vacuum chamber through a quartz window, the quartz disc and sapphire to the GaN/sapphire interface.

(14) The laser beam was electro-optically modulated to raster the beam across the wafer starting at one edge and scanning parallel to the <11$\bar{2}$0> plane of the GaN until the entire wafer area was exposed.

(15) The GaN and sapphire were cooled to room ambient temperature.

(16) The GaN and sapphire were placed in dilute HF solution for 30 minutes, following which free-standing GaN was removed from the HF and rinsed in deionized water.

(17) The GaN material was sized to a 40 mm diameter round wafer with one flat side to mark the <11$\bar{2}$0> direction, using abrasive particles.

(18) The wafer was lapped to uniform thickness and mechanically polished using 9 μm and 3 μm diamond grit.

(19) The wafer was chemically-mechanically polished to produce epitaxially ready GaN wafer.

The finished 40 mm diameter, freestanding GaN wafer was approximately 200 μm in thickness, visibly transparent and crack-free, had a dislocation density of approximately $2 \times 10^7$ cm$^{-2}$, and a root mean square surface roughness of less than 1 nm.

While the invention has been illustratively described herein with respect to various illustrative aspects, features and embodiments, it will be appreciated that numerous variations, modifications and other embodiments are possible in the practice of the present invention, and the invention therefore is to be broadly construed as encompassing all such variations, modifications and other embodiments, within its spirit and scope.

We claim:

1. A method of forming a free-standing (Al, Ga, In)N article, by the steps comprising:

providing an expitaxially compatible sacrificial template;

depositing single crystal (Al, Ga, In)N material on the template at a deposition temperature above ambient temperature to form a composite sacrificial template/(Al, Ga, In)N article including an interface between the sacrificial template and the (Al, Ga, In)N material; and parting the sacrificial template from the (Al, Ga, In)N material by at least one process selected from:
(i) before cooling of said composite template/(Al, Ga, In)N article to ambient temperature, interfacially modifying the composite sacrificial template/(Al, Ga, In)N article at an elevated temperature that is within 500° C. of said deposition temperature; and
(ii) providing localized energy at the interface between the sacrificial template and the (Al, Ga, In)N material to interfacially modifying the composite sacrificial template/(Al, Ga, In)N article, while maintaining the composite sacrificial template/(Al, Ga, In)N article at an elevated temperature that is within 500° C. of said deposition temperature.

2. The method of claim 1, wherein the step of parting the sacrificial template from the (Al, Ga, In)N material comprises step (ii) of providing localized energy at the interface.

3. The method of claim 1, wherein the step of parting the sacrificial template from the (Al, Ga, In)N material comprises step (i) of interfacially modifying the composite sacrificial template/(Al, Ga, In)N article by heating the interface to activate or induce physical or chemical change.

4. The method of claim 1, further comprising the step of providing an interlayer at the interface between the sacrificial template and the (Al, Ga, IN)N material.

5. The method of claim 4, wherein the interlayer is doped with a dopant.

6. The method of claim 5, wherein the dopant includes at least one dopant species selected from the group consisting of Si, Ge, O, Mg, Be, and/or Zn.

7. The method of claim 1, wherein the step of parting the sacrificial template from the (Al, Ga, In)N material comprises step (i) of interfacially modifying the composite sacrificial template/(Al, Ga, In)N article by generating gas at the interface.

8. The method of claim 1, wherein the step of parting the sacrificial template from the (Al, Ga, In)N material comprises step (i) of interfacially modifying the composite sacrificial template/(Al, Ga, In)N article by decomposing interfacial material.

9. The method of claim 1, wherein the step of parting the sacrificial template from the (Al, Ga, In)N material comprises step (ii) of providing localized energy at the interface by impinging acoustic energy on the interface.

10. The method of claim 1, wherein the step of parting the sacrificial template from the (Al, Ga, In)N material comprises step (ii) of providing localized energy at the interface by impinging on the interface an impingement medium selected from the group consisting of protons, ions, and particle beams.

11. The method of claim 1, wherein the step of parting the sacrificial template from the (Al, Ga, In)N material comprises step (ii) of providing localized energy at the interface by impinging a laser beam on the interface.

12. The method of claim 1, wherein die step of parting the sacrificial template from the (Al, Ga, In)N material comprises step (ii) of providing localized energy at the interface by rf coupling to a conductive interface.

13. The method of claim 1, wherein the step of parting the sacrificial template from the (Al, Ga, In)N material comprises step (i) of interfacially modifying the composite sacrificial template/Al, Ga, In)N article by etching of the interface.

14. The method of claim 1, wherein the step of parting the sacrificial template from the (Al, Ga, In)N material comprises step (i) of interfacially modifying the composite sacrificial template/Al, Ga, In)N article by selective weakening of mterfacial material.

15. The method of claim 1, wherein the step of parting the sacrificial template from the (Al, Ga, In)N material comprises step (i) of interfacially modifying the composite sacrificial template/(Al, Ga, In)N article by photodegradation of interfacial material.

16. The method of claim 1, wherein the step of parting the sacrificial template from the (Al, Ga, In)N material comprises step (i) of interfacially modifying the composite sacrificial template/Al, Ga, In)N article by a process selected from the group consisting of photonic, acoustic, physical, chemical, thermal and energetic processes.

17. The method of claim 1, wherein the step of depositing single crystal (Al, Ga, In)N material on the template comprises hydride vapor phase epitaxy (HVPE).

18. The method of claim 1, wherein the step of depositing single crystal (Al, Ga, In)N material on the template comprises metalorganic vapor phase epitaxy (MOVPE).

19. The method of claim 1, wherein the step of depositing single crystal (Al, Ga, In)N material on the template comprises chemical vapor deposition (CVD).

20. The method of claim 1, wherein the step of depositing single crystal (Al, Ga, In)N material on the template comprises molecular beam epitaxy (MBE).

21. The method of claim 1, wherein the step of parting the sacrificial template from the (Al, Ga, In)N material is carried out at an elevated temperature that is within 300° C. of the deposition temperature.

22. The method of claim 1, wherein the step of parting the sacrificial template from the (Al, Ga, In)N material is carried out at an elevated temperature that is within 200° C. of the deposition temperature.

23. The method of claim 1, wherein the step of parting the sacrificial template from the (Al, Ga, In)N material is carried out at an elevated temperature that is within 150° C. of the deposition temperature.

24. The method of claim 1, wherein the step of parting the sacrificial template from the (Al, Ga, In)N material is carried out at an elevated temperature that is within 100° C. of the deposition temperature.

25. The method of claim 1, wherein the step of parting the sacrificial template from the (Al, Ga, In)N material is carried out at an elevated temperature that is substantially the same as the deposition temperature.

26. The method of claim 1, wherein the step of parting the sacrificial template from the (Al, Ga, In)N material comprises step (ii) of providing localized energy at the interface by impinging laser energy on the interface from a Nd:YAG laser at a wavelength in the vicinity of 355 nm.

27. The method of claim 1, wherein the composite sacrificial template/(Al, Ga, In)N article has a parting threshold of greater than 150 mJ/cm$^2$ at 1000° C.

28. The method of claim 1, wherein the sacrificial template is formed of sapphire.

29. The method of claim 1, wherein the step of parting the sacrificial template from the (Al, Ga, In)N material comprises step (ii) of providing localized energy at the interface by impinging laser energy on the interface, and said laser energy has a photon energy that is greater than the bandgap of one of the (Al, Ga, In)N and sacrificial template materials, and less than the bandgap of the other material.

30. The method of claim 1, wherein the step of parting the sacrificial template from the (Al, Ga, In)N material comprises step, (ii) of providing localized energy at the interface by impinging laser energy on the interface, and said laser energy has a power density that is sufficiently high to induce chemical and/or physical change of interfacial material, so as to at least weaken interfacial adhesion of the respective template and (Al, Ga, In)N materials.

31. The method of claim 1, wherein the step of parting the sacrificial template from the (Al, Ga, In)N material camprises step (ii) of providing localized energy at the interface by impinging laser energy on the interface, and said laser energy is pulsed.

32. The method of claim 1, wherein the step of parting the sacrificial template from the (Al, Ga, In)N material comprises step (ii) of providing localized energy at the interface by impinging laser energy on the interface, and said laser energy has a Gaussian beam profile.

33. The method of claim 1, wherein the step of parting the sacrificial template from the (Al, Ga, In)N material comprises step (ii) of providing localized energy at the interface by impinging laser energy on the interface, and said laser energy has a Top Hat beam profile.

34. The method of claim 1, wherein the step of parting the sacrificial template from the (Al, Ga, In)N material comprises step (ii) of providing localized energy at the interface by impinging laser energy on the interface, and said laser energy has a uniform, cylindrically symmetric transition from high (beam center) to low (beam edge) energy.

35. The method of claim 1, wherein the step of parting the sacrificial template from the (Al, Ga, In)N material comprises step (ii) of providing localized energy at the interface by impinging laser energy on the interface, and said laser energy has a uniform, cylindrically symmetric and gradual transition from high (beam center) to low (beam edge) energy.

36. The method of claim 1, wherein the sacrificial template has a roughened quartz or matte finish at its backside.

37. The method of claim 1, wherein the step of parting the sacrificial template from the (Al, Ga, In)N material comprises step (ii) of providing localized energy at the interface by impinging laser energy on the interface, and the laser energy is impinged in a predetermined scan pattern involving translational movement of a laser beam and/or the composite sacrificial template/(Al, Ga, In)N article.

38. The method of claim 37, wherein the translational movement includes a rastering movement.

39. The method of claim 37, wherein the translational movement includes a concentrically inward perimeter movement.

40. The method of claim 37, wherein the translational movement includes a pulsed step movement, wherein the step size between successive laser pulses is from about 1 to about 200% of a spot size of the laser beam on the interface.

41. The method of claim 37, wherein the translational movement includes a pulsed step movement, wherein the step size between successive laser pulses is from about 10 to about 50% of a spot size of the laser beam above the parting threshold.

42. The method of claim 1, wherein the step of parting the sacrificial template from the (Al, Ga, In)N material comprises step (ii) of providing localized energy at the interface by impinging laser energy on the interface, and the laser energy is impinged in a predetermined scan pattern along (Al, Ga, In)N crystal planes.

43. The method of claim 1, wherein the step of parting the sacrificial template from the (Al, Ga, In)N material comprises step (ii) of providing localized energy at the interface by impinging laser energy on the interface, and the laser energy is impinged in a predetermined scan pattern along (Al, Ga, In)N crystal planes, wherein the (Al, Ga, In)N material comprises c-plane GaN and the sacrificial template comprises c-plane sapphire, and the scan pattern comprises scanning along the <11$\bar{2}$0> plane of the c-plane GaN.

44. The method of claim 1, wherein the interface comprises patterned interfacial material.

45. The method of claim 1, wherein the interface comprises a patterned interlayer.

46. The method of claim 1, wherein the step of parting the sacrificial template from the (Al, Ga, In)N material comprises step (ii) of providing localized energy at the interface by impinging laser energy on the interface, and the laser energy is impinged in a predetermined scan pattern forming gas egress passages at the interface.

47. The method of claim 1, wherein the step of parting the sacrificial template from the (Al, Ga, In)N material comprises ste (ii) of providig localized energy at the interface by impinging laser energy on the interface, and the laser energy is transmitted through the sacrificial template to the interface.

48. The method of claim 1, wherein the step of parting the sacrificial template from the (Al, Ga, In)N material comprises step (ii) of providing localized enemy at the interface by impinging laser energy on the interface, and the laser energy is transmitted through the (Al, Ga, In)N to the interface.

49. The method of claim 1, wherein the template is shielded by a cover plate during the step of depositing single crystal (Al, Ga, In)N material on the template.

50. The method of claim 1, wherein the composite sacrificial template/(Al, Ga, In)N article is sealed on its backside with a borosilicate glass during the step of depositing single crystal (Al, Ga, In)N material on the template.

51. The method of claim 1, wherein the composite sacrificial template/(Al, Ga, In)N article is sealed on its backside with a $SiC_2$ material during the step of depositing single crystal (Al, Ga, In)N material on the template.

52. The method of claim 1, wherein the composite sacrificial template/(Al, Ga, In)N article is sealed on its backside with a $Si_2N_3$ material during the step of depositing single crystal (Al, Ga, In)N material on the template.

53. The method of claim 1, wherein the step of parting the sacrificial template from the (Al, Ga, In)N material comprises step (ii) of interfacially modifying the composite sacrificial template/(Al, Ga, In)N article, as carried out in a process environment to which cracked nitrogen is introduced.

54. The method of claim 1, wherein the step of parting the sacrificial template from the (Al, Ga, In)N material comprises step (i) of interfacially modifying the composite sacrificial template/(Al, Ga, In)N article, as is carried out in a process environment to which HCl is introduced.

55. The method of claim 1, wherein the step of parting the sacrificial template from the (Al, Ga, In)N material is carried out in a process environment whose pressure is in a range of from about $10^{-6}$ to about $10^{10}$ Torr.

56. The method of claim 1, wherein the step of parting the sacrificial template from the (Al, Ga, In)N materal comprises step (ii) of providing localized energy at the interface by impinging laser energy on the interface, and monitoring reflectance of the laser energy for control of the method.

57. The method of claim 1, wherein at initiation of the step of parting the sacrificial template from the (Al, Ga, In)N material, the (Al, Ga, In)N material on the sacrificial template has a thickness greater than 50 $\mu$m.

58. The method of claim 1, wherein at initiation of the step of parting the sacrificial template from the (Al, Ga, In)N material, the (Al, Ga, In)N material on the sacrificial template has a thickness in a range of from about 100 to about 1000 $\mu$m.

59. The method of claim 1, wherein the sacrificial template is partially parted by step (i) or (ii) from the (Al, Ga, In)N material.

60. The method of claim 1, wherein the sacrificial template is partially parted by step (i) or (ii) from the (Al, Ga, In)N material, wherein the unparted area is <50% of total area of the sacrificial template at the interface, and further comprising the step of cooling the sacrificial template/(Al, Ga, In)N article to ambient temperature to complete the parting of the sacrificial template from the (Al, Ga, In)N material.

61. The method of claim 1, wherein the step of parting the sacrificial template from the (Al, Ga, In)N material comprises step (ii) of interfacially modifying the composite sacrificial template/(Al, Ga, In)N article by grinding, cutting or cleaving along low index crystalline planes.

62. The method of claim 1, wherein the step of parting the sacrificial template from the (Al, Ga, In)N material comprises step (i) of interfacially modifying the composite sacrificial template/(Al, Ga, In)N article by etching of the interface.

63. The method of claim 1, wherein a free-standing (Al, Ga, In)N article is formed and cooled to ambient temperature.

64. The method of claim 63, wherein the free-standing (Al, Ga, In)N article is cooled to ambient temperature at a rate of <10° C./min.

65. The method of claim 1, wherein the step of parting the sacrificial template from the (Al, Ga, In)N material is carried out by process (i).

66. The method of claim 1, wherein the composite sacrificial template/(Al, Ga, In)N article contains at least one interlayer between the sacrificial template and the (Al, Ga, In)N material, and wherein said at least one interlayer is effective to provide at least one of: enhanced partability of the sacrificial template from the (Al, Ga, In)N material, reduced bandgap, reduced thermal decomposition, enhanced etchability, and enhanced growth.

67. The method of claim 1, wherein the step of parting the sacrificial template from the (Al, Ga, In)N material is carried out by process (ii).

68. The method of claim 1, wherein the sacrificial template is partially parted from the (Al, Ga, In)N material by step (i) or (ii) at elevated temperature, and complete parting of the sacrificial template from the (Al, Ga, In)N material is subsequently carried out at ambient temperature.

69. The method of claim 1, further comprising protecting frontside material of the composite sacrificial template/(Al, Ga, In)N article with ammonia or other N-containing species during said step of parting the sacrificial template from the (Al, Ga, In)N material.

70. A method of forming a free-standing (Al, Ga, In)N article, by the steps comprising:
providing an epitaxially compatible sacrificial template;
depositing single crystal (Al, Ga, In)N material on the template at elevated temperature, to form a composite sacrificial template/(Al, Ga, In)N article including an interface between the sacrificial template and the (Al, Ga, In)N material; and
before the composite sacrificial template/(Al, Ga, In)N article is cooled to ambient temperature, impinging laser energy on the interface to at least partially part the sacrificial template from the (Al, Ga, In)N material to yield the free-standing (Al, Ga, In)N article.

71. The method of claim 70, comprising parting at temperature within 500° C. of said elevated temperature of the step of depositing single crystal (Al, Ga, In)N material on the template.

72. The method of claim 70, comprising parting at temperature within 300° C. of said elevated temperature of the step of depositing single crystal (Al, Ga, In)N material on the template.

73. The method of claim 70, comprising parting at temperature within 100° C. of said elevated temperature of the step of depositing single crystal (Al, Ga, In)N material on the template.

74. The method of claim 70, wherein the composite sacrificial template/(Al, Ga, In)N article contains at least one interlayer between the sacrificial template and the (Al, Ga, In)N material, and wherein said at least one interlayer is effective to provide at least one of: enhanced partability of the sacrificial template from the (Al, Ga, In)N material, reduced bandgap, reduced thermal decomposition, enhanced etchability, and enhanced growth.

75. The method of claim 70, wherein the composite sacrificial template/(Al, Ga, In)N article contains at least one interlayer between the sacrificial template and the (Al, Ga, In)N material, and wherein said at least one interlayer is effective to provide at least one of: enhanced energy absorption of the interlayer; decreased thermal decomposition of the sacrificial template and the (Al, Ga, In)N material; laser energy conversion of interfacial material to more partable material; and enhancement of growth of the (Al, Ga, In)N material.

76. The method of claim 70, wherein the composite sacrificial templatel/(Al, Ga, In)N article contains at least one interlayer between the sacrificial template and the (Al, Ga, In)N material, and wherein said at least one interlayer is in situ deposited.

77. The method of claim 70, wherein the composite sacrificial template/(Al, Ga, In)N article contains at least one interlayer between the sacrificial template and the (Al, Ga, In)N material, and wherein said at least one interlayer is ex situ deposited.

78. The method of claim 70, wherein the step of impinging laser energy on the interface to at least partially part the sacrificial template from the (Al, Ga, In)N material and yield the free-standing (Al, Ga, In)N article, comprises a step selected from the group consisting of: partially parting the sacrificial template from the (Al, Ga, In)N material at elevated temperature; fracturing the interface to part the sacrificial template from the (Al, Ga, In)N material; and completing parting of the sacrificial template from the (Al, Ga, In)N material at ambient temperature.

79. The method of claim 70, wherein the interface is weakened by subthreshold parting.

80. The method of claim 70, further comprising protecting frontside material of the composite sacrificial template/(Al, Ga, In)N article with ammonia or other N-containing species during parting at elevated temperature.

81. The method of claim 70, further comprising removal of residual (Al, Ga, In) from the free-standing (Al, Ga, In)N article with HCl.

82. The method of claim 70, wherein the free-standing (Al, Ga, In)N article has a thickness of from about 1 to about 1000 $\mu$m.

83. The method of claim 70, further comprising forming the free-standing (Al, Ga, In)N article into wafers having a thickness of from about 100 to about 1000 $\mu$m.

84. The method of claim 70, wherein the free-standing (Al, Ga, In)N article is a (Al, Ga, In)N boule having a thickness of from about 1 to about 100 $\mu$m.

85. The method of claim 70, wherein the free-standing (Al, Ga, In)N article is parted during the depositing step.

86. The method of claim 70, wherein the free-standing (Al, Ga, In)N article is parted after the depositing step.

87. The method of claim 70, wherein the step of impinging laser energy on the interface is carried out in multiple impingements.

88. The method of claim 70, wherein the depositing and impinging laser energy on the interface is carried out followed by additional depositing of single crystal (Al, Ga, In)N material.

89. The method of claim 70, wherein the composite sacrificial template/(Al, Ga, In)N article is transferred to another environment from an environment of the depositing step.

90. The method of claim 70, wherein the composite sacrificial template/(Al, Ga, In)N article is maintained in a same environment as the depositing step.

91. The method of claim 70, wherein the sacrificial template constitutes a backside template in the composite sacrificial template/(Al, Ga, In)N article and the step of impinging laser energy on the interface is carried out with transmission of laser energy through said backside template.

92. The method of claim 70, wherein the step of impinging laser energy on the interface comprises light rastering.

93. The method of claim 70, wherein the step of impinging laser energy on the interface comprises light scanning from an outside edge of the composite sacrificial template/(Al, Ga, In)N article.

94. The method of claim 70, wherein the sacrificial template is formed of sapphire and the step of impinging laser energy on the interface comprises light rastering along the <11$\bar{2}$0> direction of the (Al, Ga, In)N material of the composite sacrificial template/(Al, Ga, In)N article.

95. The method of claim 70, wherein the step of impinging laser energy on the interface comprises light rastering along a direction of a crystal plane of the (Al, Ga, In)N material of the composite sacrificial template/(Al, Ga, In)N article.

96. The method of claim 70, wherein the (Al, Ga, In)N material is GaN and the laser energy is supplied by a Nd:YAG or an excimer laser.

97. The method of claim 70, wherein backside deposition on the composite sacrificial template/(Al, Ga, In)N article is at least partially suppressed by a step selected from the group consisting of: use of a cover plate during the depositing step; molten glass sealing of the sacrificial template; use of vacuum to fixed position the composite sacrificial template/(Al, Ga, In)N article out of exposure to (Al, Ga, In)N material during said depositing step; physically fixedly positioning the composite sacrificial template/(Al, Ga, In)N article out of exposure to (Al, Ga, In)N material during said depositing step; and application of a coating on the sacrifacial template that is inhibitive of backside deposits thereon.

98. The method of claim 70, wherein backside deposition on the composite sacrificial template/(Al, Ga, In)N article is at least partially suppressed by application of a coating on the sacrificial template that is inhibitive of backside deposits thereon, wherein the coating is of a material selected from the group consisting of $SiO_2$ and $Si_3N_4$.

99. The method of claim 98, wherein the coating material is removed in situ.

100. A method of forming a free-standing (Al, Ga, In)N article, by the steps comprising:
providing an epitaxially compatible sacrificial template;
depositing single crystal (Al, Ga, In)N material on the template at elevated temperature, to form a composite sacrificial template/(Al, Ga, In)N article including an interface between the sacrificial template and the (Al, Ga, In)N material; and
parting the sacrificial template from the (Al, Ga, In)N material tn yield the free-standing (Al, Ga, In)N article, wherein during the step of depositing the single crystal (Al, Ga, In)N material on the template, backside deposition on the composite sacrificial template/(Al, Ga, In)N article is at least partially suppressed by a step selected from the group consisting of: use of a cover plate during the depositing step; molten glass sealing of the sacrificial template; use of vacuum to fix the position of the composite sacrificial template/(Al, Ga, In)N article out of exposure to (Al, Ga, In)N material during said depositing step; physically fixedly positioning the composite sacrificial template/(Al, Ga, In)N article out of exposure to (Al, Ga, In)N material during said depositing step; and application of a coating on the sacrificial template that is inhibitive of backside deposits thereon.

101. The method of claim 100, wherein the step of parting comprises a step selected from the group consisting of: localizing energy at the interface; heating the interface to a temperature which activates or induces physical or chemical change of interfacial material; cooling the interface; cooling the interface and then reheating the interface; energetically modifying the interface; energetically exciting the interface; providing an interlayer at the interface; doping the interface; generating gas at the interface; decomposing interfacial material; impinging acoustic energy on the interface; impinging particle beam energy on the interface; if coupling to a conductive interface; etching of the interface; selective weakening of interfacial material; photodegradation of interfacial material.

102. The method of claim 100, wherein the step of parting the sacrificial template from the (Al, Ga, In)N material to yield the free-standing (Al, Ga, In)N article, comprises parting at temperature within 500° C. of said elevated temperature of the step of depositing single crystal (Al, Ga, In)N material on the template.

103. The method of claim 100, wherein the step of parting the sacrificial template from the (Al, Ga, In)N material to yield the free-standing (Al, Ga, In)N article, comprises parting at temperature within 300° C. of said elevated temperature of the step of depositing single crystal (Al, Ga, In)N material on the template.

104. The method of claim 100, wherein the step of parting the sacrificial template from the (Al, Ga, In)N material to yield the free-standing (Al, Ga, In)N article, comprises parting at temperature within 100° C. of said elevated temperature of the step of depositing single crystal (Al, Ga, In)N material on the template.

105. The method of claim 100, wherein the composite sacrificial template/(Al, Ga, In)N article contains at least one interlayer between the sacrificial template and the (Al, Ga, In)N material, and wherein said at least one interlayer is effective to provide at least one of: enhanced partability of the sacrificial template from the (Al, Ga, In)N material, reduced bandgap, reduced thermal decomposition, enhanced etchability, and enhanced growth.

106. The method of claim 100, wherein the composite sacrificial template/(Al, Ga, In)N article contains at least one interlayer between the sacrificial template and the (Al, Ga, In)N material, and wherein said at least one interlayer is in situ deposited.

107. The method of claim 100, wherein the composite sacrificial template/(Al, Ga, In)N article contains at least one interlayer between the sacrificial template and the (Al, Ga, In)N material, and wherein said at least one interlayer is ex situ deposited.

108. The method of claim 100, wherein said step of parting the sacrificial template from the (Al, Ga, In)N material is carried out at temperature at or near the elevated temperature of the depositing step, with protection for frontside material of the composite sacrificial template/(Al, Ga, In)N article with ammonia or other N-containing species during said parting.

109. A method of forming a free-standing (Al, Ga, In)N article, by the steps comprising:
providing an epitaxially compatible sacrificial template;
depositing single crystal (Al, Ga, In)N material on the template at elevated temperature, to form a composite sacrificial template/(Al, Ga, In)N article including an interface between the sacrificial template and the (Al, Ga, In)N material; and
parting the sacrificial template from the (Al, Ga, In)N material using impingement of laser energy an the interface, while maintaining the composite sacrificial template/(Al, Ga, In)N article at temperature at or near the elevated temperature of the depositing step to yield the free-standing (Al, Ga, In)N article.

110. The method of claim 109, wherein the step of parting the sacrificial template from the (Al, Ga, In)N material to yield the free-standing (Al, Ga, In)N article, comprises parting at temperature within 500° C. of said elevated temperature of the step of depositing single crystal (Al, Ga, In)N material on the template.

111. The method of claim 109, wherein the step of parting the sacrificial template from the (Al, Ga, In)N material to yield the free-standing (Al, Ga, In)N article, comprises parting at temperature within 300° C. of said elevated temperature of the step of depositing single crystal (Al, Ga, In)N material on the template.

112. The method of claim 109, wherein the step of parting the sacrificial template from the (Al, Ga, In)N material to yield the free-standing (Al, Ga, In)N article, comprises parting at temperature within 100° C. of said elevated temperature of the step of depositing single crystal (Al, Ga, In)N material on the template.

113. The method of claim 109, wherein the composite sacrificial template/(Al, Ga, In)N article contains at least one interlayer between the sacrificial template and the (Al, Ga, In)N material, and wherein said at least one interlayer is effective to provide at least one of: enhanced partability of the sacrificial template from the (Al, Ga, In)N material, reduced thermal decomposition, enhanced convertibility to a more partable composite article, and enhanced growth.

114. The method of claim 109, wherein the composite sacrificial template/(Al, Ga, In)N article contains at least one interlayer between the sacrificial template and the (Al, Ga, In)N material, and wherein said at least one interlayer is in situ deposited.

115. The method of claim 109, wherein the composite sacrificial template/(Al, Ga, In)N article contains at least one interlayer between the sacrificial template and the (Al, Ga, In)N material, and wherein said at least one interlayer is ex situ deposited.

116. The method of claim 109, wherein the parting step comprises: partially parting the sacrificial template from the (Al, Ga, In)N material at elevated temperature; and completing parting of the sacrificial template from the (Al, Ga, In)N material at ambient temperature.

117. The method of claim 109, further comprising protecting frontside material of the composite sacrificial template/(Al, Ga, In)N article with ammonia or other N-containing species during said parting.

118. The method of claim 109, further comprising removal of residual (Al, Ga, In) from the free-standing (Al, Ga, In)N article with HCl.

119. The method of claim 109, wherein the depositing and/or parting steps is conducted in an inert atmosphere.

120. The method of claim 109, further comprising forming the free-standing (Al, Ga, In)N article into wafers having a thickness of from about 0.1 to about 100 mm.

121. The method of claim 109, further comprising growing additional (Al, Ga, In)N on the free-standing (Al, Ga, In)N article.

122. The method of claim 109, wherein the sacrificial template is formed of sapphire and the step of parting comprises laser rastering along the <11$\bar{2}$0> plane of the (Al, Ga, In)N material of the composite sacrificial template/(Al, Ga, In)N article.

123. The method of claim 109, wherein the parting step comprises laser rastering along a direction of a crystal plane of the (Al, Ga, In)N material of the composite sacrificial template/(Al, Ga, In)N article.

124. The method of claim 109, wherein the (Al, Ga, In)N material is GaN and the laser energy is supplied by a Nd:YAG or an excimer laser.

125. The method of claim 109, wherein during the step of depositing the single crystal (Al, Ga, In)N material, backside deposition on the composite sacrificial template/(Al, Ga, In)N article is at least partially suppressed by a step selected from the group consisting of: use of a cover plate during the depositing step; molten glass sealing of the sacrificial template; use of vacuum to fixed position the composite sacrificial template/(Al, Ga, In)N article out of exposure to (Al, Ga, In)N material during said depositing step; physically fixedly positioning the composite sacrificial template/Al, Ga, In)N article out of exposure to (Al, Ga, In)N material during said depositing step; and application of a coating on the sacrificial template that is inhibitive of backside deposits thereon.

126. The method of claim 109, wherein during the step of depositing the single crystal (Al, Ga, In)N material, backside deposition on the composite sacrificial template/(Al, Ga, In)N article is at least partially suppressed by application of a coating on the sacrificial template that is inhibitive of backside deposits thereon, wherein the coating comprises a material selected from the group consisting of $SiO)_2$ and $Si_3N_4$.

127. The method of claim 126, wherein the coating is removed by etching, wherein the etching further removes laser energy-absorbing deposits.

128. The method of claim 109, wherein edge deposits of energy-absorbing material resulting from the depositing step are removed, including a removing step selected from the group consisting of physical grinding, sawing, cleaving and chemical removal.

129. A method of forming a free-standing (Al, Ga, In)N article, by the steps comprising:
providing an epitaxially compatible sacrificial template;
depositing single crystal (Al, Ga, In)N material on the template by HVPE at an elevated deposition temperature, to form a composite sacrificial template/ (Al, Ga, In)N article including an interface between the sacrificial template and the (Al, Ga, In)N material; and
parting the sacrificial template from the (Al, Ga, In)N material to yield the free-standing (Al, Ga, In)N article at temperatures in excess of the deposition temperature of the (Al, Ga, In)N material, while cracked nitrogen is introduced during said parting.

130. A method of forming a free-standing (Al, Ga, In)N article, by the steps comprising:

providing an epitaxially compatible sacrificial template;

depositing single crystal (Al, Ga, In)N material on the template by HVPE at elevated temperature, to form a composite sacrificial template/(Al, Ga, In)N article including an interface between the sacrificial template and the (Al, Ga, In)N material; and parting the sacrificial template from the (Al, Ga, In)N material to yield the free-standing (Al, Ga, In)N article, wherein during the step of depositing the single crystal (Al, Ga, In)N material, backside deposition one the composite sacrificial template/(Al, Ga, In)N article is at least partially suppressed by the application of a coating on the sacrificial template that is inhibitive of backside deposits thereon, wherein the coating comprises a material selected from the group consisting of $SiO_2$ and $Si_3N_4$.

* * * * *

UNITED STATES PATENT AND TRADEMARK OFFICE
CERTIFICATE OF CORRECTION

| | |
|---|---|
| PATENT NO. | : 6,958,093 B2 |
| DATED | : October 25, 2005 |
| INVENTOR(S) | : Robert P. Vaudo et al. |

It is certified that error appears in the above-identified patent and that said Letters Patent is hereby corrected as shown below:

<u>Title page,</u>
Item [56], References Cited, OTHER PUBLICATIONS, add
-- Kelly, M.K., Ambacher, O., Dahlheimber, B., Groos., G., Dimitrov, R., Angerer, H., Stutzmann, M., *Appl. Phys. Lett.*, Vol. 69, No. 12, 1749-1751, 1996 --.

<u>Column 8,</u>
Line 61, "spinet" should be -- spinel --.

<u>Column 11,</u>
Line 52, "minimize rejections" should be -- minimize reflections --.

<u>Column 21,</u>
Line 57, "wherein die step" should be -- wherein the step --.

<u>Column 22,</u>
Line 66, "step, (ii) of" should be -- step (ii) of --.

<u>Column 24,</u>
Line 15, "ste (ii) of" should be -- step (ii) of --.
Line 21, "localized enemy" should be -- localized energy --.
Line 33, "$SiC_2$" should be -- $SiO_2$ --.
Line 48, "as is carried out" should be -- as carried out --.

<u>Column 28,</u>
Line 26, "if coupling" should be -- rf coupling --.
Line 59-60, "is in situ" should be -- is ex situ --.

<u>Column 29,</u>
Line 14, "an the" should be -- on the --.

UNITED STATES PATENT AND TRADEMARK OFFICE
CERTIFICATE OF CORRECTION

PATENT NO. : 6,958,093 B2
DATED : October 25, 2005
INVENTOR(S) : Robert P. Vaudo et al.

It is certified that error appears in the above-identified patent and that said Letters Patent is hereby corrected as shown below:

Column 30,
Line 46, "SiO)$_2$" should be -- SiO$_2$ --.

Signed and Sealed this

Twenty-fifth Day of April, 2006

JON W. DUDAS
*Director of the United States Patent and Trademark Office*